United States Patent
Park et al.

(10) Patent No.: US 10,490,702 B2
(45) Date of Patent: Nov. 26, 2019

(54) LIGHT-EMITTING DEVICE AND LIGHT-EMITTING DEVICE PACKAGE COMPRISING SAME

(71) Applicant: LG INNOTEK CO., LTD., Seoul (KR)

(72) Inventors: Su Ik Park, Seoul (KR); Min Sung Kim, Seoul (KR); Youn Joon Sung, Seoul (KR); Yong Gyeong Lee, Seoul (KR); Kwang Yong Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/754,639

(22) PCT Filed: Aug. 25, 2016

(86) PCT No.: PCT/KR2016/009469
§ 371 (c)(1),
(2) Date: Feb. 23, 2018

(87) PCT Pub. No.: WO2017/034356
PCT Pub. Date: Mar. 2, 2017

(65) Prior Publication Data
US 2018/0219133 A1    Aug. 2, 2018

(30) Foreign Application Priority Data

Aug. 25, 2015 (KR) .................. 10-2015-0119636
Jul. 29, 2016 (KR) .................. 10-2016-0097384

(51) Int. Cl.
*H01L 33/40* (2010.01)
*H01L 33/46* (2010.01)
(Continued)

(52) U.S. Cl.
CPC ............ *H01L 33/405* (2013.01); *H01L 33/10* (2013.01); *H01L 33/26* (2013.01); *H01L 33/38* (2013.01);
(Continued)

(58) Field of Classification Search
CPC .......................... H01L 33/382; H01L 33/60
See application file for complete search history.

(56) References Cited

U.S. PATENT DOCUMENTS

2011/0057223 A1    3/2011    Hwang
2012/0007121 A1    1/2012    Lee et al.
(Continued)

FOREIGN PATENT DOCUMENTS

EP    2 296 197    3/2011
EP    2 432 036    3/2012
(Continued)

OTHER PUBLICATIONS

International Search Report (with English Translation) and Written Opinion dated Nov. 18, 2016 issued in Application No. PCT/KR2016/009469.
(Continued)

*Primary Examiner* — Farun Lu
(74) *Attorney, Agent, or Firm* — KED & Associates LLP

(57) ABSTRACT

Embodiments disclose a light-emitting device including a light-emitting structure including a first conductive semiconductor layer, a second conductive semiconductor layer, an active layer disposed between the first conductive semiconductor layer and the second conductive semiconductor layer, and a first recess and a second recess passing through the second conductive semiconductor layer and the active layer and disposed up to a partial region of the first conductive semiconductor layer, a connection electrode disposed inside the first recess and electrically connected to the first conductive semiconductor layer, a reflective layer disposed inside the second recess, and an insulation layer configured to electrically insulate the reflective layer and the light-emitting structure, and a light-emitting device package including the same.

20 Claims, 17 Drawing Sheets

(51) Int. Cl.
    *H01L 33/10*     (2010.01)
    *H01L 33/26*     (2010.01)
    *H01L 33/38*     (2010.01)
    *H01L 33/44*     (2010.01)
    *H01L 33/60*     (2010.01)

(52) U.S. Cl.
    CPC ............ *H01L 33/382* (2013.01); *H01L 33/44* (2013.01); *H01L 33/46* (2013.01); *H01L 33/60* (2013.01)

(56) References Cited

U.S. PATENT DOCUMENTS

2013/0113007 A1* 5/2013 Choi .................... H01L 33/382
                                                                                                                                                    257/98
2015/0200230 A1    7/2015  Jang et al.

FOREIGN PATENT DOCUMENTS

| JP | 4501234 | 1/2002 |
|---|---|---|
| JP | 2007-173579 | 7/2007 |
| KR | 10-2011-0117964 | 10/2011 |
| KR | 10-2014-0006429 | 1/2014 |
| KR | 10-2014-0057811 | 5/2014 |
| KR | 10-2014-0146354 | 12/2014 |

OTHER PUBLICATIONS

European Search Report dated Sep. 6, 2018 issued in Application No. 16839644.8.

* cited by examiner

LIGHT-EMITTING DEVICE AND LIGHT-EMITTING DEVICE PACKAGE COMPRISING SAME

CROSS-REFERENCE TO RELATED PATENT APPLICATIONS

This application is a U.S. National Stage Application under 35 U.S.C. § 371 of PCT Application No. PCT/KR2016/009469, filed Aug. 25, 2016, which claims priority to Korean Patent Application No. 10-2015-0119636, filed Aug. 25, 2015, and Korean Patent Application No. 10-2016-0097384, filed Jul. 29, 2016, whose entire disclosures are hereby incorporated by reference.

TECHNICAL FIELD

Embodiments are related to a light-emitting device.

BACKGROUND ART

A group III-V compound semiconductor such as GaN and AlGaN is widely used for optoelectronics and electronic devices due to its advantages including having a wide and easily-adjustable band-gap energy.

Particularly, light-emitting devices such as a light-emitting diode or a laser diode using a group III-V or group II-VI compound semiconductor material may implement various colors such as red, green, blue, and ultraviolet (UV) due to development of thin film growth technique and device materials, may also implement highly-efficient white light by using a fluorescent material or combining colors, and have advantages of low power consumption, semi-permanent service life, rapid response speed, safety, and eco-friendliness in comparison to conventional light sources such as a fluorescent lamp and an incandescent lamp.

Therefore, application of the light-emitting devices has been expanded to a transmission module of an optical communication means, a light-emitting diode backlight which is a substitute for a cold cathode fluorescence lamp (CCFL) constituting a backlight of a liquid crystal display (LCD) device, a white light-emitting diode lighting device capable of substituting for a fluorescent lamp or an incandescent lamp, a vehicle headlight, and a traffic light.

A light-emitting device has a light-emitting structure including a first conductive semiconductor layer, an active layer, and a second conductive semiconductor layer, and a first electrode and a second electrode are respectively disposed on the first conductive semiconductor layer and the second conductive semiconductor layer. The light-emitting device emits light, which has energy determined by a unique energy band of a material forming the active layer, by electrons injected through the first conductive semiconductor layer and holes injected through the second conductive semiconductor layer meeting each other. Light emitted from the active layer may vary in accordance with a composition of the material forming the active layer, and may be blue light, UV light, deep UV light or the like.

FIG. 1 is a view illustrating a conventional light-emitting device.

A vertical light-emitting device illustrated in FIG. 1 has a light-emitting structure (10), which includes a first conductive semiconductor layer (12), an active layer (14), and a second conductive semiconductor layer (16), disposed above a second electrode (16), and has a first electrode (13) disposed above the first conductive semiconductor layer (12).

Light extraction mostly occurs in a horizontal direction in the conventional light-emitting device. In this case, there is a problem in that, when an optical path along which light generated from the active layer (14) of the light-emitting device is extracted to the outside of the light-emitting device lengthens, absorption occurs inside the light-emitting diode, and thus light extraction efficiency is degraded.

Further, there is a problem in that light emission mostly occurs at a certain portion at which current spreading is weak, most of the emitted light is absorbed at the portion from which the light is emitted, and thus light extraction efficiency is degraded.

DISCLOSURE

Technical Problem

It is an aspect of embodiments to provide a light-emitting device having higher light extraction efficiency.

Technical Solution

A light-emitting device according to one embodiment of the present disclosure includes a light-emitting structure including a first conductive semiconductor layer, a second conductive semiconductor layer, an active layer disposed between the first conductive semiconductor layer and the second conductive semiconductor layer, and a first recess and a second recess passing through the second conductive semiconductor layer and the active layer and disposed up to a partial region of the first conductive semiconductor layer, a connection electrode disposed inside the first recess and electrically connected to the first conductive semiconductor layer, a reflective layer disposed inside the second recess, and an insulation layer configured to electrically insulate the reflective layer and the light-emitting structure from each other.

The active layer may generate light in an ultraviolet wavelength range.

The reflective layer may reflect light in an ultraviolet wavelength range.

The first recess may include a first-first recess and a first-second recess, and the second recess may be disposed between the first-first recess and the first-second recess.

The connection electrode may include a plurality of connection electrodes, and the light-emitting device may include a first conductive layer electrically connected to the plurality of connection electrodes.

The light-emitting device may include a first electrode disposed between the connection electrode and the first conductive semiconductor layer.

The second recess may include a second-first recess surrounding the first-first recess and a second-second recess surrounding the first-second recess, and the light-emitting structure may include a first light-emitting region configured by the first-first recess and the second-first recess and a second light-emitting region configured by the first-second recess and the second-second recess.

Each of the first light-emitting region and the second light-emitting region may include the first conductive semiconductor layer, the second conductive semiconductor layer, and the active layer, and the second conductive semiconductor layer and the active layer of each of the first light-emitting region and the second light-emitting region may be separated by the second recess.

The second-first recess and the second-second recess may be connected to each other.

The second-first recess and the second-second recess may be spaced apart from each other.

The first recess may have a polygonal shape or circular shape in plan view.

A protruding height of the second recess may be larger than or equal to that of the first recess, and the protruding heights of the first recess and the second recess may be a distance from the active layer to an upper surface of the first recess and a distance from the active layer to an upper surface of the second recess, respectively.

A plurality of the first recess and the second recess may extend in a first direction, and the first direction may be a direction perpendicular to a thickness direction of the light-emitting structure.

A length in the first direction of the second recess may be larger than a length in the first direction of at least one first recess neighboring the second recess.

The insulation layer may include a first insulation layer and a second insulation layer, and the reflective layer may be disposed between the first insulation layer and the second insulation layer.

The light-emitting device may include a second conductive layer disposed below the second conductive semiconductor layer, and a first conductive layer disposed below the second conductive layer with the second insulation layer disposed therebetween.

The light-emitting device may include a first conductive layer electrically connected to the first conductive semiconductor layer, the first conductive layer may include a first conductive protrusion disposed inside the second recess, and the reflective layer may be disposed on the first conductive protrusion.

The first conductive layer may be connected to the connection electrode.

A light-emitting device package according to one embodiment of the present disclosure includes a body including at least one pad, and a light-emitting device disposed on the body and electrically connected to the pad, wherein the light-emitting device includes a light-emitting structure including a first conductive semiconductor layer, a second conductive semiconductor layer, an active layer disposed between the first conductive semiconductor layer and the second conductive semiconductor layer, and a first recess and a second recess passing through the second conductive semiconductor layer and the active layer and disposed up to a partial region of the first conductive semiconductor layer, a connection electrode disposed inside the first recess and electrically connected to the first conductive semiconductor layer, a reflective layer disposed inside the second recess, and an insulation layer configured to electrically insulate the reflective layer and the light-emitting structure from each other.

Advantageous Effects

According to embodiments, light extraction efficiency can be improved.

Further, an optical output can be improved.

Further, an operating voltage can be improved.

Various advantageous effects of the present disclosure are not limited to the above and should be more easily understood in a process of describing detailed embodiments of the present disclosure.

BEST MODE OF THE INVENTION

The present embodiments may be modified in different forms or various embodiments may be combined with each other, and the scope of the present disclosure is not limited to each of the embodiments described below.

Even when a matter described with respect to a specific embodiment is not described with respect to another embodiment, the matter may be understood as description related to the other embodiment as long as there is no description contrary or contradictory to the matter with respect to the other embodiment.

For example, when a feature of Element A is described with respect to a specific embodiment, and a feature of Element B is described with respect to another embodiment, an embodiment in which Element A and Element B are combined should be understood as belonging to the scope of the present disclosure even when the embodiment is not expressly mentioned, as long as there is no description contrary or contradictory to the embodiment.

In description of an embodiment according to the present disclosure, in a case in which an element is described as being formed "on or under" each element, an element being formed on or under another element includes both a case in which two elements directly come into contact with each other and a case in which two elements are indirectly connected to each other with still another element being disposed therebetween. In addition, "on or above" may mean downward as well as upward with respect to one element.

A light-emitting device according to embodiments may be a vertical light-emitting device in which a first electrode configured to supply a current to a first conductive semiconductor layer is disposed below a light-emitting structure so that an amount of reflection of light emitted to an upper portion of the light-emitting structure may be reduced, and the first electrode may pass through a second conductive semiconductor layer and an active layer and be electrically connected to the first conductive semiconductor layer.

Figure 1:
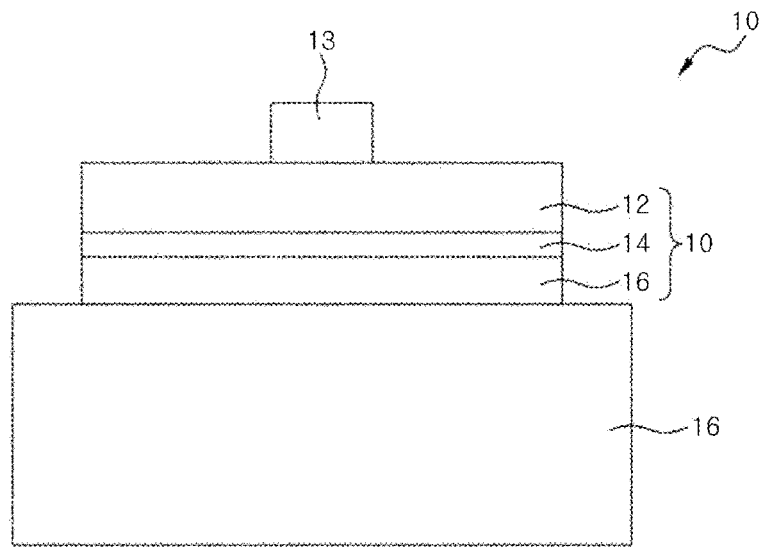
FIG. 1 is a view illustrating a conventional light-emitting device.
Figure 2:
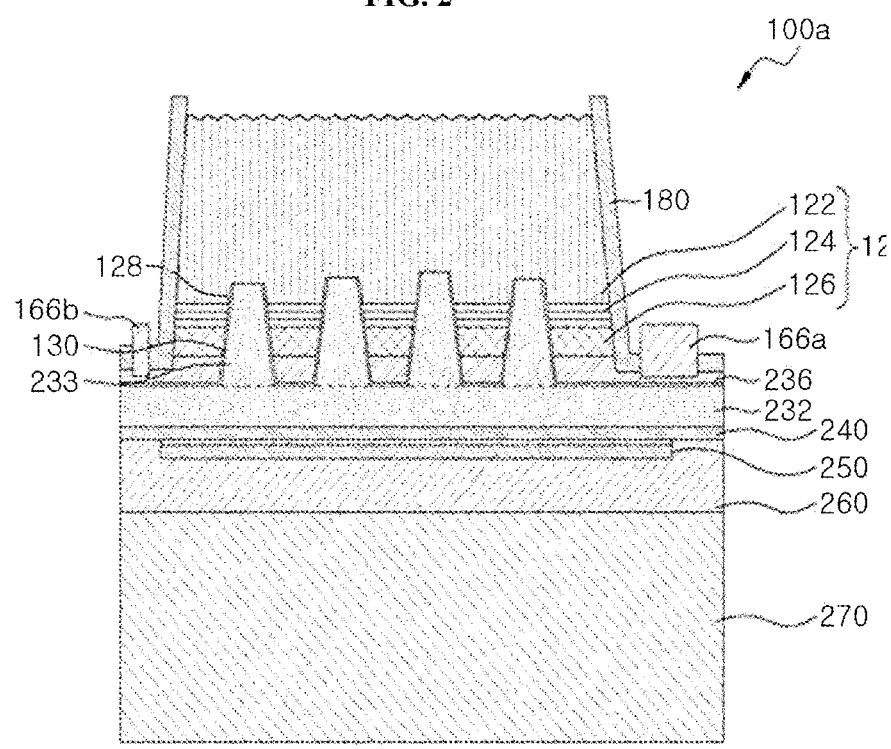
FIG. 2 is a view illustrating a light-emitting device according to a first embodiment.

FIG. 2 is a view illustrating a light-emitting device according to a first embodiment.

A light-emitting device 100a according to an embodiment may have a second conductive layer 236 disposed below a light-emitting structure 120, an insulation layer 130 and a first conductive layer 232 disposed below a second electrode, and a connection electrode 233 extending from the first conductive layer 232 and electrically coming into contact with a first conductive semiconductor layer 222 in the light-emitting structure 120. Second electrode pads 236a and 236b may be disposed at an edge region of the second conductive layer 236 to correspond to an edge of the light-emitting structure 120.

The light-emitting structure 120 includes a first conductive semiconductor layer 122, an active layer 124, and a second conductive semiconductor layer 126.

The first conductive semiconductor layer 122 may be implemented with a III-V or II-VI compound semiconductor and doped with a first conductive dopant. The first conductive semiconductor layer 122 may be formed with any one or more of semiconductor materials having the formula $Al_xIn_yGa_{(1-x-y)}N$ ($0 \leq x \leq 1$, $0 \leq y \leq 1$, $0 \leq x+y \leq 1$), e.g., AlGaN, GaN, InAlGaN, AlGaAs, GaP, GaAs, GaAsP, and AlGaInP.

When the first conductive semiconductor layer 122 is an n-type semiconductor layer, the first conductive dopant may include an n-type dopant such as Si, Ge, Sn, Se, and Te. The first conductive semiconductor layer 122 may be formed as a single layer or multiple layers, but is not limited thereto.

The active layer 124 may be disposed between the first conductive semiconductor layer 122 and the second conductive semiconductor layer 126 and may include any one of a single well structure, a multi-well structure, a single quantum well structure, a multi-quantum well (MQW) structure, a quantum dot structure, and a quantum wire structure.

The active layer 124 may be formed with a pair structure consisting of a well layer and a barrier layer using a group III-V element compound semiconductor material, e.g., any one or more pair structures of AlGaN/AlGaN, InGaN/GaN, InGaN/InGaN, AlGaN/GaN, InAlGaN/GaN, GaAs(InGaAs)/AlGaAs, and GaP(InGaP)/AlGaP, but is not limited thereto. In this case, the well layer may be formed with a material having a smaller energy band gap than that of the barrier layer.

The second conductive semiconductor layer 126 may be formed with a semiconductor compound. The second conductive semiconductor layer 126 may be implemented with a group III-V or group II-VI compound semiconductor and doped with a second conductive dopant. The second conductive semiconductor layer 126 may be formed with any one or more of semiconductor materials having the formula $In_xAl_yGa_{1-x-y}N$ ($0 \leq x \leq 1$, $0 \leq y \leq 1$, $0 \leq x+y \leq 1$), e.g., AlGaN, GaNAlInN, AlGaAs, GaP, GaAs, GaAsP, and AlGaInP.

When the second conductive semiconductor layer 126 is a p-type semiconductor layer, the second conductive dopant may be a p-type dopant such as Mg, Zn, Ca, Sr, and Ba. The second conductive semiconductor layer 126 may be formed as a single layer or multiple layers, but is not limited thereto.

When the second conductive semiconductor layer 126 is AlGaN, hole injection may not be smoothly performed due to low electrical conductivity. Therefore, GaN, which has relatively higher electrical conductivity, may be disposed at a lower surface of the second conductive semiconductor layer 126.

Although not illustrated, an electron blocking layer may be disposed between the active layer 124 and the second conductive semiconductor layer 126. The electron blocking layer may be formed with a superlattice structure. For example, AlGaN, which is doped with the second conductive dopant, may be disposed as superlattices, or a plurality of GaN layers having different aluminum ratios may be alternately disposed as superlattices.

A surface of the first conductive semiconductor layer 122 may have a concave-convex portion formed thereon as illustrated so that light extraction efficiency is improved.

The second conductive layer 236 may be disposed below the second conductive semiconductor layer 126. The second conductive layer 236 may be disposed to come into surface contact with the second conductive semiconductor layer 126 but may not come into surface contact with the second conductive semiconductor layer 126 in an region in which the connection electrode 233 is formed. An edge of the second conductive layer 236 may be disposed more outward than an edge of the second conductive semiconductor layer 126. This is to secure an region in which the second electrode pads 236a and 236b will be disposed.

The second conductive layer 236 may be formed with a conductive material, specifically, formed with a metal, and more specifically, formed with a single-layer or multi-layer structure including at least one of Ag, Al, Ti, Cr, Ni, Cu, and Au. The second conductive layer may be a concept encompassing a capping layer and a p-ohmic electrode.

A passivation layer 180 may be formed at a periphery of the light-emitting structure 120. The passivation layer 180 may be formed with an insulation material, and the insulation material may be formed with an oxide or nitride, which is non-conductive. As an example, the passivation layer 180 may be formed with a silicon oxide ($SiO_2$) layer, an oxynitride layer, or an aluminum oxide layer.

In addition to being disposed at the periphery of the light-emitting structure 120, the passivation layer 180 may also be disposed at an edge of the second conductive layer 236, which is disposed more outward than the above-described edge of the second conductive semiconductor layer 126. The passivation layer 180 disposed on the edge of the second conductive layer 236 may be open in an region at which the second electrode pads 236a and 236b are formed.

A first conductive layer (the first conductive layer 232) may be disposed below the second conductive layer 236 with the insulation layer 130 disposed therebetween. The first conductive layer 232 may be formed with a conductive material, specifically, formed with a metal, and more specifically, formed with a single-layer or multi-layer structure including at least one of Ag, Al, Ti, Cr, Ni, Cu, and Au.

A plurality of connection electrodes 233 are disposed to extend upward from the first conductive layer 232. The connection electrodes 233 pass through the insulation layer 130, the second conductive layer 236, the second conductive semiconductor layer 126, and the active layer 124 and extend up to a portion of the first conductive semiconductor layer 122 so that an upper surface of the connection electrode 233 may come into surface contact with the first conductive semiconductor layer 122. A light-emitting structure 229 may include a plurality of recesses 128 in which the plurality of connection electrodes 233 are disposed.

The connection electrode 233 may be defined as an region from a height equal to that of a lower surface of the second conductive semiconductor layer 126 to an upper surface of the recess 128 in the recess 128. A defined region of the recess 128 may be equal to a defined region of the connection electrode 233. The connection electrode 233 may be electrically connected to the first conductive layer 232 at a lower surface of the recess 128.

A cross-section of each of the connection electrodes 233 may have a circular shape or a polygonal shape. The above-described insulation layer 130 may be disposed to extend from a periphery of the connection electrode 233 and electrically insulate the connection electrode 233 from the second conductive layer 236, the second conductive semiconductor layer 126, and the active layer 124.

An ohmic layer 240 may be disposed below the first conductive layer 232.

The ohmic layer 240 may have a thickness of about 200 Å. The ohmic layer 240 may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—GaZnO (AGZO), In—GaZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but a material of the ohmic layer 240 is not limited thereto.

A reflective plate 250 that may act as a reflective electrode may be disposed below the ohmic layer. The reflective layer 250 may be formed with a metal layer including W, Ti, Mo, Al, Ag, Ni, Pt, Rh, or an alloy including Al, Ag, Pt, or Rh. Al, Ag, or the like may effectively reflect light traveling downward in FIG. 2 from the active layer 124 and considerably improve light extraction efficiency of a light-emitting device.

A width of the reflective plate 250 may be smaller than a width of the ohmic layer 240, and a channel layer 260 may be disposed below the reflective plate 250. A width of the channel layer 260 may be larger than the width of the reflective plate 250, and thus the channel layer 260 may be disposed to surround the reflective plate 250. The channel layer 260 may be formed with a conductive material, e.g., Au or Sn.

A conductive support substrate 270 may be formed with a conductive material such as a metal or a semiconductor material. A metal with excellent electrical conductivity or thermal conductivity may be used, and the conductive support substrate 270 may be formed with a material with high thermal conductivity (e.g., metal or the like) because the conductive support substrate 270 should be able to sufficiently emit heat generated when a light-emitting device is operated. For example, the conductive support substrate 270 may be formed with a material selected from the group consisting of Mo, Si, W, Cu, and Al or an alloy thereof, and may selectively include Au, a Cu-alloy, Ni, Cu—W, a carrier wafer (e.g., GaN, Si, Ge, GaAs, ZnO, SiGe, SiC, SiGe, $Ga_2O_3$), and the like.

The support substrate 270 may have a thickness in the range of 50 to 200 micrometers to have a mechanical strength that allows the support substrate 270 to be well-separated as a separate chip through a scribing process and a breaking process while deflection of the entire nitride semiconductor is not caused.

Although not illustrated, the conductive support substrate 270 is coupled to a junction layer 236 and the channel layer 260, and the conductive support substrate 270 may be formed with a material selected from the group consisting of Au, Sn, In, Al, Si, Ag, Ni, and Cu or an alloy thereof.

In the light-emitting device 100a according to the embodiment, a current may be uniformly supplied to an entire region of the first conductive semiconductor layer 122 from the first conductive layer 236 through the connection electrode 233. A current may also be uniformly supplied to the second conductive semiconductor layer 126 coming into surface contact with the second conductive layer 236.

The electrode pads 236a and 236b are disposed above the second conductive layer 236 at the periphery of the light-emitting structure 120, and thus a current may be evenly supplied to the entire region of the second conductive layer 236.

Therefore, the frequency at which electrons injected through the first conductive semiconductor layer 122 and holes injected through the second conductive semiconductor layer 126 are coupled in the active layer 124 may be increased, and thus an amount of light emitted from the active layer 124 may be increased.

Figure 3:
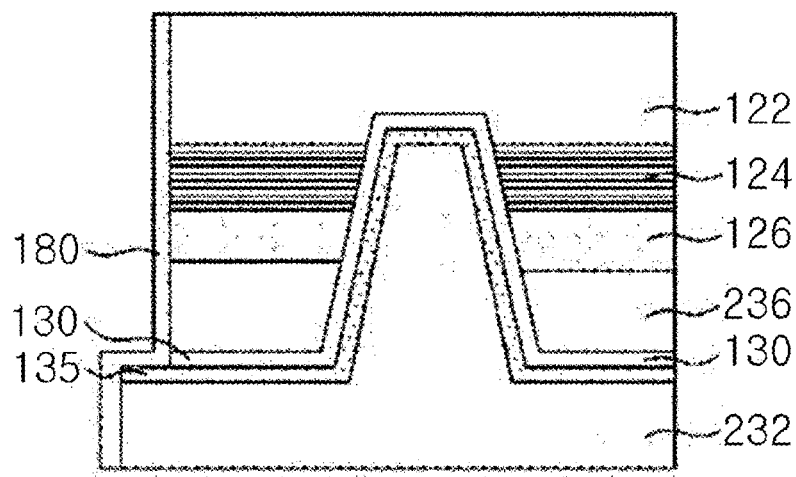
FIG. 3 is a view illustrating a light-emitting device according to a second embodiment.

FIG. 3 is a view illustrating a light-emitting device according to a second embodiment.

Referring to FIG. 3, since a light-emitting device according to the embodiment fundamentally has the same structure as the light-emitting device described above with reference to FIG. 2, overlapping description will be omitted.

The light-emitting device according to the embodiment may include a reflective layer 135 disposed on a connection electrode 233.

More specifically, the reflective layer 135 may be disposed between an insulation layer 130 a first conductive layer 232.

The reflective layer 135 may be disposed below the insulation layer 130 and have the same shape as that of the insulation layer 130.

A light-emitting device 200 according to the embodiment may be a light-emitting device that emits UV light. A first conductive semiconductor layer 122 used in the light-emitting device that emits UV light has a feature in which current spreading is poor.

Since the current spreading characteristic of the first conductive semiconductor layer 122 is poor, there is a problem in that light emission mostly occurs around the first conductive layer 232 that supplies a current.

The light-emitting device according to the embodiment may have a reflective layer 135 disposed at a lower surface of the connection electrode 233 at which most light emissions occur, more specifically, between the insulation layer 130 disposed above the connection electrode 233 and the first conductive layer 232. Therefore, light mostly emitted from around the connection electrode 233 is reflected to prevent the emitted light from being absorbed into the first conductive layer 232, and thus there is an effect of increasing light extraction efficiency.

Figure 4:
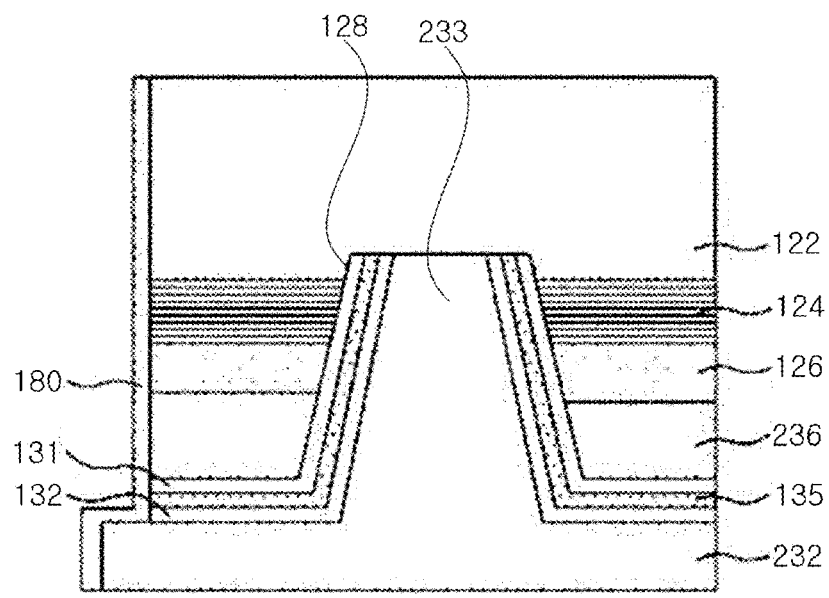
FIG. 4 is a view illustrating a light-emitting device according to a third embodiment.

FIG. 4 is a view illustrating a light-emitting device according to a third embodiment.

Referring to FIG. 4, description of parts of a light-emitting device according to the embodiment identical to those in the structures of the light-emitting devices described above with reference to FIGS. 2 and 3 will be omitted.

The light-emitting device according to the embodiment may further include a reflective layer 135 disposed at a connection electrode 233.

The reflective layer 135 may be disposed between insulation layers 130. The insulation layers 130 may include a first insulation layer 131 disposed above and a second insulation layer 132 disposed below the first insulation layer 131, and the reflective layer 135 may be disposed between the first insulation layer 131 and the second insulation layer 132.

Materials constituting the first insulation layer 131 and the second insulation layer 132 may be the same.

The materials constituting the first insulation layer 131 and the second insulation layer 132 may be different from each other.

The light-emitting device illustrated in FIG. 3 may have the reflective layer 135 disposed at the lower surface of the connection electrode 233 at which most light emissions occur. More specifically, the reflective layer 135 may be disposed between the insulation layer 130 disposed above the connection electrode 233 and the first conductive layer 232 and reflect light mostly emitted from around the connection electrode 233. Therefore, the emitted light may be prevented from being absorbed into the first conductive layer 232, and thus light extraction efficiency may be increased.

On the contrary, the light-emitting device according to the present embodiment has the reflective layer 135 disposed between the first insulation layer 131 and the second insulation layer 132 so that light is prevented from being absorbed into the second insulation layer 132 and the first conductive layer 232, and light extraction efficiency is increased.

According to the embodiment, the reflective layer 135 may be disposed inside a first recess 128 in which the connection electrode 233 is disposed. Therefore, as the number of the first recesses 128 is increased, a contact area between the connection electrode 233 and the first conductive semiconductor layer 122 may be increased, and current distribution efficiency may be improved. Light output from around the connection electrode 233 may be reflected upward by the reflective layer 135, and light extraction efficiency may be improved.

A thickness of the insulation layer 130 of the light-emitting device illustrated in FIG. 3 may be larger than or equal to at least a thickness of the first insulation layer 131.

A thickness of the second insulation layer 132 according to the present embodiment may be larger than or equal to the thickness of the insulation layer 130 illustrated in FIG. 3.

However, the thicknesses of the first insulation layer 131 and the second insulation layer 132 that provide a space in which the reflective layer 135 is accommodated are not limited to those illustrated in the present embodiment, may be changed in accordance with a user's need, and do not limit the scope of the present disclosure.

Figure 5:
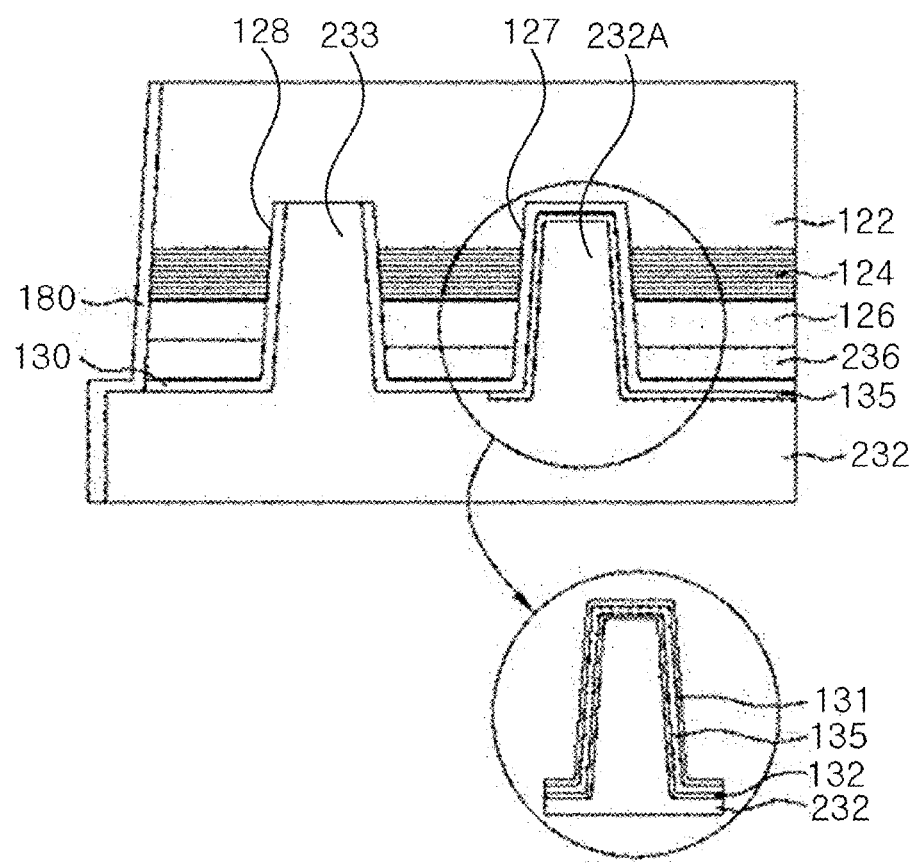
FIG. 5 is a view illustrating a light-emitting device according to a fourth embodiment.

FIG. 5 is a view illustrating a light-emitting device according to a fourth embodiment.

Referring to FIG. 5, description of parts of a light-emitting device according to the embodiment identical to those in the structure of the light-emitting device described above with reference to FIG. 2 will be omitted.

While the reflective layer 135 for reflecting light emitted from the active layer 124 is disposed at the connection electrode 233 in the light-emitting devices illustrated in FIGS. 3 and 4, a reflective layer 135 for reflecting light emitted from an active layer 124 may be spaced a predetermined distance apart from a connection electrode 233 in the light-emitting device according to the present embodiment. That is, a plurality of connection electrodes 233 may be respectively disposed inside a plurality of first recesses 128, and the reflective layer 135 may be disposed inside a second recess 127. The second recess 127 may be disposed between the plurality of first recesses 128.

The light-emitting device according to the embodiment may be a light-emitting device that emits UV light. Generally, a light-emitting device for emitting UV light extracts light mostly in a horizontal direction.

However, light emitted from the light-emitting device is mostly absorbed inside the light-emitting device while moving in the horizontal direction to be extracted to the outside of the light-emitting device, and thus there is a problem in that light extraction efficiency is degraded.

To solve the problem, according to the embodiment, a light-emitting device in which light moving in the horizontal direction may be reflected by a reflective layer 135 and extracted upward may be provided.

The reflective layer 135 according to the embodiment may be disposed to protrude to a predetermined height or more from an insulation layer 130.

The active layer 124 is disposed above the insulation layer 130. Therefore, the reflective layer 135 should be disposed at a height that is at least equal to that of the active layer 124 or larger in order to reflect light traveling in the horizontal direction from the active layer 124 upward.

Therefore, both the first recess 128 in which the connection electrode 233 is disposed and the second recess 127 in which the reflective layer 135 is disposed may be disposed at a height larger than or equal to that of the active layer 226.

This will be described in detail below.

The light-emitting device according to the embodiment may include a plurality of first conductive protrusions 232A disposed at positions spaced a predetermined distance apart from the connection electrode 233, the insulation layer 130 disposed on the first conductive protrusion 232A and configured to insulate the first conductive protrusion 232A, and the reflective layer 135 disposed between the first conductive protrusion 232A and the insulation layer 130 and configured to reflect light.

The first conductive protrusion 232A may be disposed to protrude higher than at least the active layer 124 in order to reflect light emitted from the active layer 124 and traveling in the horizontal direction.

As illustrated in the drawing, the first conductive protrusion 232A may be disposed to protrude to have the same height as a protruding height of the connection electrode 233.

However, this is merely one embodiment, and the first conductive protrusion 232A may protrude to any height as long as the reflective layer 232A is disposed to reflect light emitted from the active layer 124 and increase light extraction efficiency. The shape, the protruding height, and the width of the first conductive protrusion 232A may be changed in accordance with a user's need, and the scope of the present disclosure is not limited thereby.

The reflective layer 135 may be disposed below the insulation layer 130 as illustrated in FIGS. 3 and 4 or may be disposed between the first insulation layer 131 and the second insulation layer 132. In the embodiment shown in FIG. 5, the reflective layer 135 may be electrically connected to the first conductive layer 232. The reflective layer 135 may also be electrically insulated from the first conductive layer 232 by the second insulation layer 132.

The position and shape at which the reflective layer 135 is disposed may vary in accordance with a user's need, and the scope of the present disclosure is not limited thereby.

Figure 6:
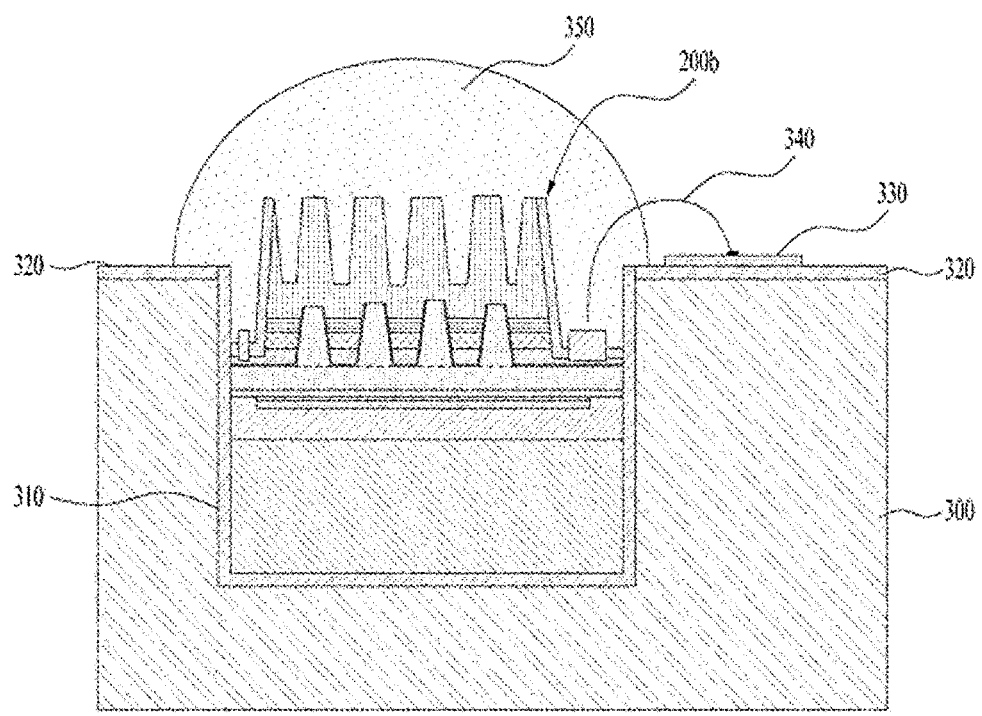
FIG. 6 is a view illustrating a light-emitting device package according to one embodiment.

FIG. 6 is a view illustrating a light-emitting device package according to one embodiment.

The light-emitting device package according to the embodiment may have a groove formed in a conductive substrate 300, and a light-emitting device 200b according to the above-described embodiments may be disposed in the above-mentioned groove. At least a portion of a side surface of the light-emitting device 200b and a bottom surface thereof may be coupled to the conductive substrate 300 by a solder 310 or the like.

A dielectric layer 320 may be disposed at an upper surface of the conductive substrate 300 constituting a body, and a pad 330 for bonding may be disposed above the dielectric layer 320 so that one electrode of the light-emitting device 200b may be bonded thereto by a wire 340. The other electrode of the light-emitting device 200b may be coupled to the conductive substrate 300 and electrically connected thereto.

A molding part 350 is formed at a periphery of the light-emitting device 200b. The molding part 350 may protect the light-emitting device 200b and change a path of light emitted from the light-emitting device 350.

One or a plurality of light-emitting devices may be built in the above-described light-emitting device package, and the number of light-emitting devices is not limited.

A plurality of light-emitting device packages according to the embodiment may be arrayed on a substrate, and a light guide plate, a prism sheet, a diffusion sheet, and the like, which are optical members, may be disposed on an optical path of the light-emitting device package. Such light-emitting device packages, the substrate, and the optical members may serve as a backlight unit.

A display device, an indicating device, and a lighting device including the light-emitting device package according to the embodiment may be implemented.

Here, the display device may include a bottom cover, a reflective plate disposed on the bottom cover, a light-emitting module configured to emit light, a light guide plate disposed in front of the reflective plate and configured to guide light emitted from the light-emitting module forward, an optical sheet including prism sheets disposed in front of the light guide plate, a display panel disposed in front of the optical sheet, an image signal output circuit connected to the display panel and configured to supply an image signal to the display panel, and a color filter disposed in front of the display panel. Here, the bottom cover, the reflective plate, the light-emitting module, the light guide plate, and the optical sheet may form a backlight unit.

The lighting device may include a light source module including a substrate and the light-emitting device package according to the embodiment, a heat dissipating body configured to emit heat from the light source module, and a power providing part configured to process or convert an electrical signal received from the outside to provide the electrical signal to the light source module. For example, the lighting device may include a lamp, a headlamp, or a street lamp.

The headlamp may include a light-emitting module including light-emitting device packages disposed on a substrate, a reflector configured to reflect light irradiated from the light-emitting module in a certain direction, e.g., forward, a lens configured to refract light reflected by the reflector forward, and a shade configured to block or reflect a portion of light reflected by the reflector and heading toward the lens so that a light distribution pattern desired by a designer is formed.

Figure 7:
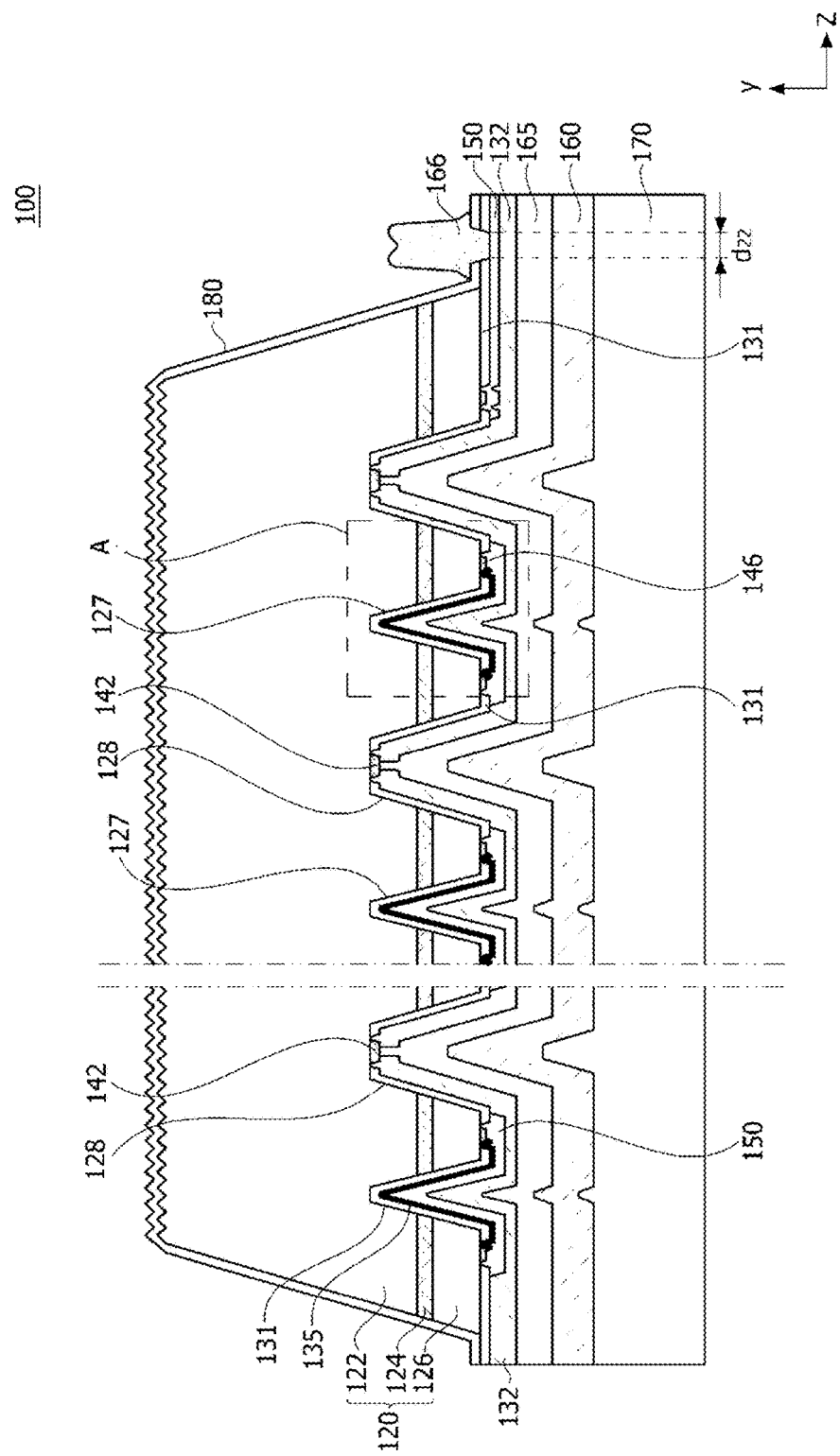
FIG. 7 is a cross-sectional view of a light-emitting device according to a fifth embodiment of the present disclosure.
Figure 8:
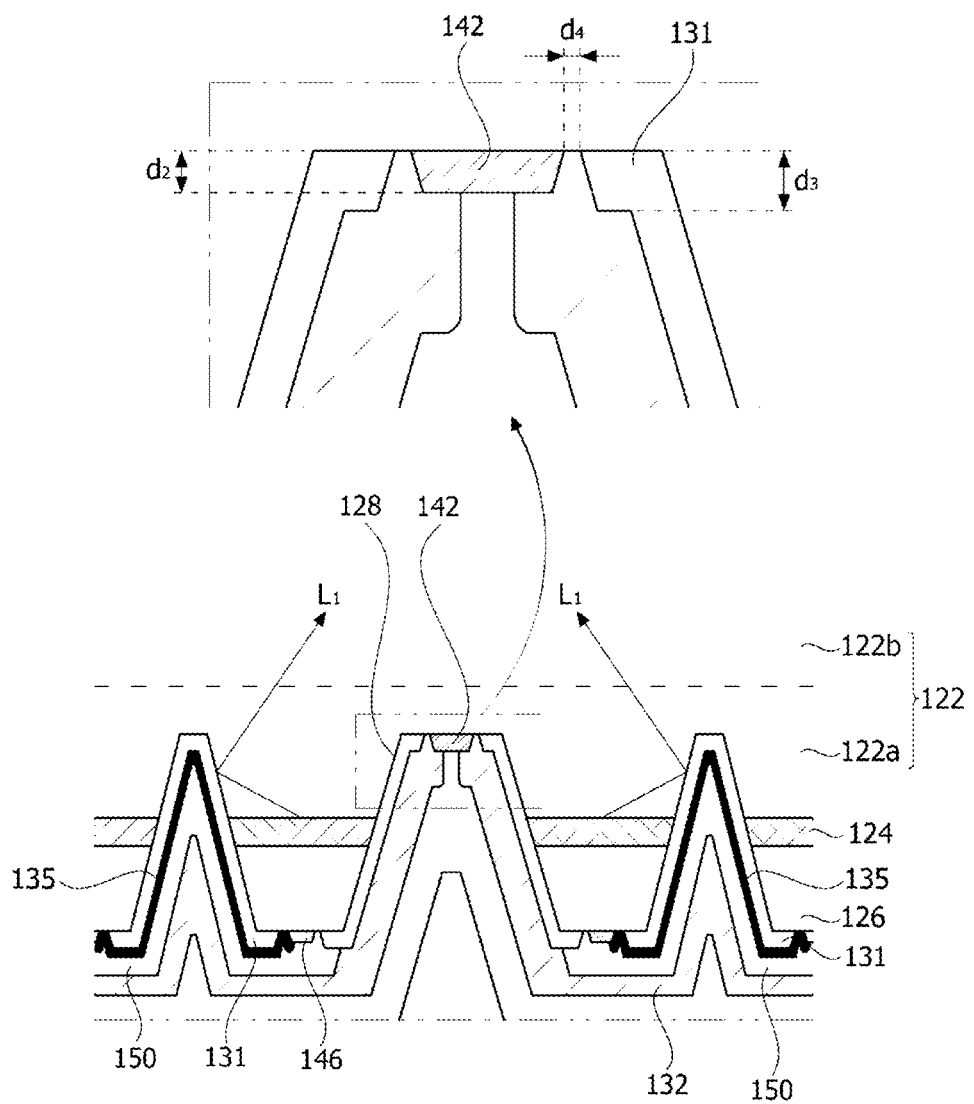
FIG. 8 is a conceptual diagram showing a process in which light is reflected upward by a reflective layer.
Figure 9:
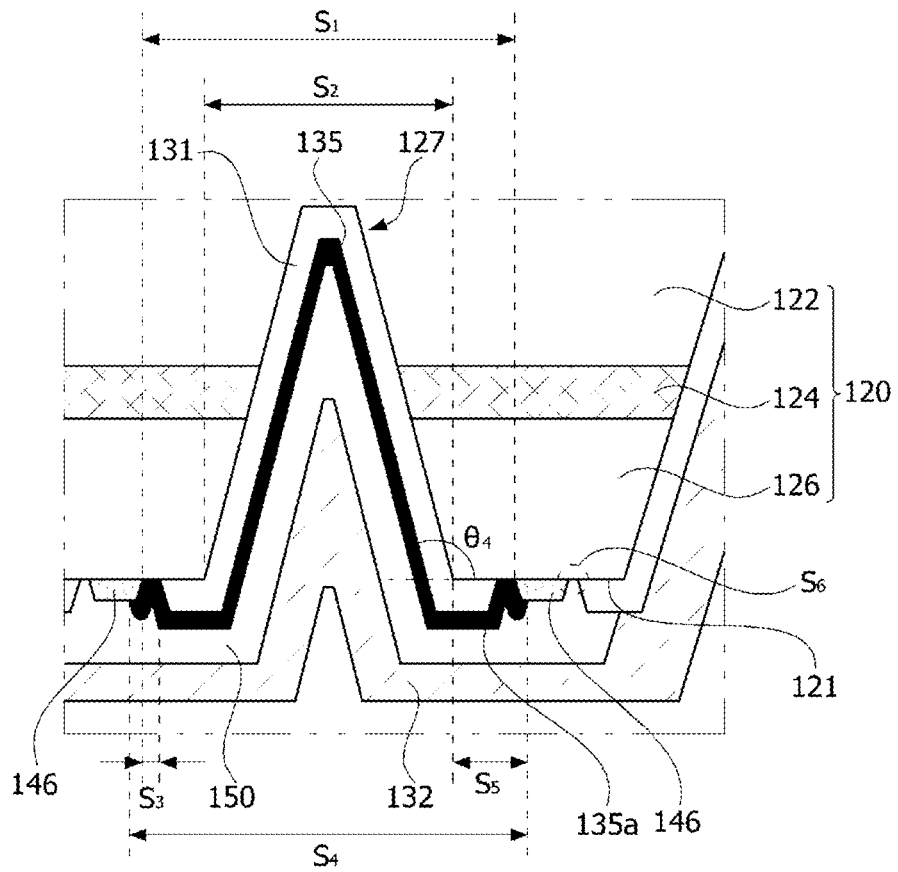
FIG. 9 is an enlarged view of Portion A in FIG. 7.
Figure 10:
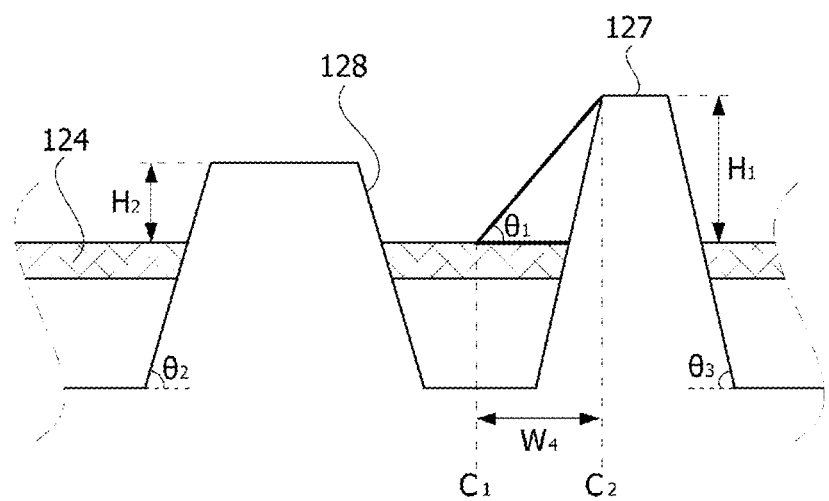
FIG. 10 is a view for describing a height difference between a first recess and a second recess.

FIG. 7 is a cross-sectional view of a light-emitting device according to a fifth embodiment of the present disclosure, FIG. 8 is a conceptual diagram showing a process in which light is reflected upward by a reflective layer, FIG. 9 is an enlarged view of Portion A in FIG. 7, and FIG. 10 is a view for describing a height difference between a first recess and a second recess.

Referring to FIG. 7, a light-emitting device according to the embodiment includes a light-emitting structure 120 including a first conductive semiconductor layer 122, a second conductive semiconductor layer 126, and an active layer 124, a first electrode 142 electrically connected to the first conductive semiconductor layer 122, a second electrode 146 electrically connected to the second conductive semiconductor layer 126, and a reflective layer 135 disposed inside a second recess 127.

The light-emitting structure 120 according to the embodiment may emit light in a UV wavelength range. As an example, the light-emitting structure 120 may output light (UV-A) in a near UV wavelength range, output light (UV-B) in a far UV wavelength range, or emit light (UV-C) in a deep UV wavelength range. The UV wavelength range may be determined by a ratio of Al in the light-emitting structure 120.

As an example, light (UV-A) in the near UV wavelength range may have a wavelength in the range of 320 nm to 420 nm, light (UV-B) in the far UV wavelength range may have a wavelength in the range of 280 nm to 320 nm, and light (UV-C) in the deep UV wavelength range may have a wavelength in the range of 100 nm to 280 nm.

The light-emitting structure 120 includes a plurality of first recesses 128 passing through the second conductive semiconductor layer 126 and the active layer 124 and formed up to a partial region of the first conductive semiconductor layer 122, and at least one second recess 127 disposed between the plurality of first recesses 128.

A first insulation layer 131 may be formed on the first recess 128 and the second recess 127. The first insulation layer 131 may electrically insulate the reflective layer 135 from the active layer 124 and the first conductive semiconductor layer 122. The first insulation layer 131 may extend from the first recess 128 and the second recess 127 toward an upper portion of the second conductive semiconductor layer 126.

A first electrode 142 and the second electrode 146 may be ohmic electrodes. The first electrode 142 and the second electrode 146 may be formed including at least one of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, but materials of the first electrode 142 and the second electrode 146 are not limited thereto.

The reflective layer 135 may be disposed inside the second recess 127. Specifically, the reflective layer 135 may be disposed on the first insulation layer 131 in the second recess 127.

A material having a high reflectance in a UV wavelength range may be selected for the reflective layer 135. The reflective layer 135 may include a conductive material. As an example, the reflective layer 135 may include Al. When a thickness of an Al reflective layer 135 is about 30 nm to 100 nm, the Al reflective layer 135 may reflect 80% or more of light in a UV wavelength range. Therefore, the Al reflective layer 135 may prevent light output from the active layer 124 from being absorbed into a semiconductor layer.

Referring to FIG. 8, when the composition of Al in the light-emitting structure 120 is increased, the current spreading characteristic in the light-emitting structure 120 may be degraded. An amount of light emitted sideward from the active layer 124 is increased in comparison to a GaN-based blue light-emitting device (TM mode). Such a TM mode may occur in a light-emitting device that emits light having a wavelength in a UV wavelength range.

According to the embodiment, by etching a portion of a region in which a current density is low, and forming the reflective layer 135, light L1 may be reflected upward by the reflective layer 135. Therefore, absorption of light in the light-emitting structure 120 may be reduced, and light extraction efficiency may be improved. An angle of beam spread of the light-emitting device may also be adjusted.

The first conductive semiconductor layer 122 may be implemented with a group III-V or group II-VI compound semiconductor, and the first conductive semiconductor layer 122 may be doped with a first dopant. A material of the first conductive semiconductor layer 122 may be selected from semiconductor materials having the formula $In_{x1}Al_{y1}Ga_{1-x1-y1}N$ ($0 \leq x1 \leq 1$, $0 \leq y1 \leq 1$, $0 \leq x1+y1 \leq 1$), e.g., GaN, AlGaN, InGaN, InAlGaN, and the like. The first dopant may be an n-type dopant such as Si, Ge, Sn, Se, and Te. When the first dopant is an n-type dopant, the first conductive semiconductor layer 122 doped with the first dopant may be an n-type semiconductor layer.

The first conductive semiconductor layer 122 may have a low-concentration layer 122a in which Al concentration is relatively low and a high-concentration layer 122b in which Al concentration is relatively high. The Al concentration may be 60% to 70% in the high-concentration layer 122b, and the Al concentration may be 40% to 50% in the low-concentration layer 122a. The low-concentration layer 122a is disposed to be adjacent to the active layer 124.

The first electrode 142 may be disposed on the low-concentration layer to secure a relatively smooth current injection characteristic. That is, the first recess 128 is preferably formed up to a region of the low-concentration layer 122a. This is because the Al concentration is high and thus the current spreading characteristic is relatively low in the high-concentration layer 122b.

The active layer 124 is a layer at which electrons (or holes) injected through the first conductive semiconductor layer 122 and holes (or electrons) injected through the second conductive semiconductor layer 126 meet each other. The active layer 124 may be transitioned to a low energy level as the electrons and the holes are recombined and generate light having a wavelength corresponding thereto.

The active layer 124 may have any one of a single well structure, a multi-well structure, a single quantum well structure, a multi-quantum well (MQW) structure, a quantum dot structure, and a quantum wire structure, but the structure of the active layer 124 is not limited thereto. The active layer may include Al.

The second conductive semiconductor layer 126 may be formed on the active layer 124 and implemented with a group III-V or group II-VI compound semiconductor, and the second conductive semiconductor layer 126 may be doped with a second dopant. The second conductive semiconductor layer 126 may be formed with a material selected from semiconductor materials having the formula $In_{x5}Al_{y2}Ga_{1-x5-y2}N$ ($0 \leq x5 \leq 1$, $0 \leq y2 \leq 1$, $0 \leq x5+y2 \leq 1$), i.e., AlInN, AlGaAs, GaP, GaAs, GaAsP, and AlGaInP. When the second dopant is a p-type dopant such as Mg, Zn, Ca, Sr, and Ba, the second conductive semiconductor layer 126 doped with the second dopant may be a p-type semiconductor layer.

When the second conductive semiconductor layer 126 is AlGaN, hole injection may not be smoothly performed due to low electrical conductivity. Therefore, a material with relatively high electrical conductivity, e.g., a GaN-based material, may be disposed at a lower surface of the second conductive semiconductor layer 126.

A thickness d2 of the first electrode 142 may be smaller than a thickness d3 of the first insulation layer 131, and a separation distance d4 between the first electrode 142 and the first insulation layer 131 may be in the range of 0 μm to 4 μm. The thickness d2 of the first electrode 142 may be 40% to 80% of the thickness d3 of the first insulation layer 131.

In the case in which the thickness d2 of the first electrode 142 is 40% to 80% of the thickness d3 of the first insulation layer 131, problems such as separation and crack caused by degradation of a step coverage characteristic that occurs when a second insulation layer 132 and a first conductive layer 165 are disposed may be solved. More preferably, the separation distance d4 between the first insulation layer 131 and the first electrode 142 may be in the range of 1 μm to 3 μm. By having the preferable separation distance, a gap-fill characteristic of the second insulation layer 132 may be improved.

Referring to FIG. 9, the reflective layer 135 may cover one side surface of the second electrode 146 and a portion of an upper surface thereof. By such a configuration, light introduced to a portion between the first insulation layer 131 and the second electrode 146 may be reflected upward. However, the reflective layer 135 formed of Al has a relatively poor step coverage, and a leakage current may be generated therein due to a migration characteristic. Because of this, reliability may be degraded. Therefore, it may not be preferable for the reflective layer 1355 to completely cover the second electrode 146.

The second electrode 146 may be disposed at a lower surface 121 of the light-emitting structure. The thickness of the second electrode 146 may be 80% of the thickness of the first insulation layer 131 or smaller. Because of this, problems such as crack or separation of the reflective layer 135 or a capping layer 150 caused by degradation of a step coverage that occurs when the reflective layer 135 and the capping layer 150 are disposed may be solved.

A distance S1 between a plurality of second electrodes may be in the range of 3 μm to 60 μm. In a case in which the distance S1 between the plurality of second electrodes is less than 3 μm, a width of the second recess 127 is reduced, and thus it is difficult to form the reflective layer 135 therein. In a case in which the distance exceeds 60 μm, an area of the second electrode 146 is reduced such that an operating voltage may be increased, and optical output may be lowered due to a problem of removing an effective light-emitting region.

A width S2 of the reflective layer may be in the range of 3 μm to 30 μm. It is difficult to form the reflective layer in the second recess 127 when the width S2 of the reflective layer is less than 3 μm, and when the width S2 exceeds 30 μm, the area of the second electrode 146 is reduced, and thus there is a problem in that an operating voltage is increased.

The width S2 of the reflective layer 135 may be equal to the width of the second recess 127. The width of the first recess and the width of the second recess 127 may be a maximum width formed at the lower surface 121 of the light-emitting structure.

The reflective layer 135 may include an extension 135a extending from the second recess 127 toward the second electrode 146. The extension 135a may electrically connect second electrodes 146 separated by the second recess 127 to each other.

A width S5 of the extension 135a may be in the range of 0 μm to 20 μm. In a case in which the width S5 of the extension is 0 μm, the second electrode 146 may extend up to a lower surface of the second recess 127 and be electrically connected to the reflective layer 135. In a case in which the width S5 is 20 μm or larger, since an area in which the second electrode 146 and the extension 135a vertically overlap each other is too large, a separation phenomenon may occur due to a difference in a heat expansion coefficient or the like. A width S4 of the reflective layer including the extension 135a may be in the range of 20 μm to 60 μm.

A first separation distance S3 between the second electrode 146 and the first insulation layer 131 may be in the range of 0 μm to 4 μm. In a case in which the separation distance is larger than 4 μm, an area in which the second electrode 146 is disposed is reduced, and thus an operating voltage may be increased. More preferably, the separation distance S3 between the first insulation layer 131 and the second electrode 146 may be in the range of 1 μm to 4 μm. When the reflective layer 135 is disposed within the preferably separation distance S3, it is sufficient to satisfy a gap-fill characteristic.

The reflective layer 135 may be disposed within the first separation distance S3 between the second electrode 146 and the first insulation layer 131. Within the first separation distance S3, the reflective layer 135 may come into contact with a side surface and an upper surface of the first insulation layer 131 and a side surface and an upper surface of the second electrode 146. A region in which Schottky junction between the reflective layer 135 and the second conductive semiconductor layer 126 is formed may be disposed within the first separation distance S3, and by the formation of the Schottky junction, current distribution may be facilitated.

An angle θ4 between an inclined part of the reflective layer 135 and the lower surface of the second conductive semiconductor layer 126 may be in the range of 90° to 145°. Etching of the second conductive semiconductor layer 126 is difficult when the angle of inclination θ4 is smaller than 90°, and when the angle of inclination θ4 is larger than 145°, an area of an etched active layer is increased, and thus there is a problem in that light emission efficiency is degraded.

The capping layer 150 may cover the reflective layer 135 and the second electrode 146. Therefore, a second electrode pad 166, the capping layer 150, the reflective layer 135, and the second electrode 146 may form a single electric channel.

The capping layer 150 may completely surround the reflective layer 135 and the second electrode 146 and come into contact with the side surface and the upper surface of the first insulation layer 131. Therefore, the capping layer 150 and the second electrode 146 may serve as a second conductive layer. The capping layer 150 is formed with a material whose adhesive force with the first insulation layer 131 is high. The capping layer 150 may be formed with at least one material selected from the group consisting of materials such as Cr, Al, Ti, Ni, and Au or an alloy thereof, and may be formed with a single layer or a plurality of layers.

When the capping layer 150 comes into contact with the side surface and the upper surface of the first insulation layer 131, thermal and electrical reliabilities of the reflective layer 135 and the second electrode 146 may be improved. Also, the capping layer 150 may have a reflecting function of reflecting light transmitted through a partial region of the first insulation layer 131 and emitted toward a substrate 170 and light emitted through a portion between the first insulation layer 131 and the second electrode 146 and emitted toward the substrate 170 upward.

The capping layer 150 may be disposed within a second separation distance S6 between the first insulation layer 131 and the second electrode 146. Within the second separation distance S6, the capping layer 150 may come into contact with a side surface and an upper surface of the second electrode 146 and a side surface and an upper surface of the first insulation layer 131. Also, within the second separation distance, a region in which the capping layer 150 and the second conductive semiconductor layer 126 come into contact with each other and Schottky junction is formed may be disposed, and by the formation of the Schottky junction, current distribution may be facilitated.

Referring again to FIG. 7, the first conductive layer 165 and a junction layer 160 may be disposed in accordance with the lower surface of the light-emitting structure 120 and shapes of the first recess 128 and the second recess 127. The first conductive layer 165 may be formed with a material having excellent reflectance. As an example, the first conductive layer 165 may include Al or Ag. In the case in which the first conductive layer 165 includes Al or Ag, the first conductive layer 165 may serve to reflect light emitted from the active layer 124 toward the substrate 170 upward, and thus light extraction efficiency may be improved.

The second insulation layer 132 electrically insulates the reflective layer 135, the second electrode 146, and the capping layer 150 from the first conductive layer 165. The first conductive layer 165 may pass through the second insulation layer 132 and be electrically connected to the first electrode 142.

At a portion at which the first electrode 142 and the first conductive layer 165 are connected to each other, a width of the first conductive layer 165 may be smaller than a width of a lower surface of the first electrode 142. In a case in which the width of the first conductive layer 165 is larger than the width of the lower surface of the first electrode 142 at the portion at which the first electrode 142 and the first conductive layer 165 are connected to each other, since a width of the second insulation layer 132, which should be removed, has to be larger than the width of the lower surface of the first electrode 142, an upper surface of the first conductive semiconductor layer 122 may be damaged. In the case in which the upper surface of the first conductive semiconductor layer 122 is damaged, reliability may be degraded.

The thickness of the first insulation layer 131 may be 40% to 80% of the thickness of the second insulation layer 132. When the range of 40% to 80% is satisfied, since the thickness of the first insulation layer 131 is reduced, and an upper surface of the reflective layer 135 becomes closer to the first conductive semiconductor layer 122, light extraction efficiency may be improved.

As an example, the thickness of the first insulation layer 131 may be in the range of 3000 Å to 7000 Å. When the thickness is smaller than 3000 Å, electrical reliability may be worsened. When the thickness is larger than 7000 Å, separation or crack may be caused due to a poor step coverage characteristic of the reflective layer 135 or the capping layer 150 when the reflective layer 135 and the capping layer 150 are disposed above and beside the first insulation layer 131. When the separation or crack is caused, there may be a problem in that electrical reliability is worsened or light extraction efficiency is degraded.

The thickness of the second insulation layer 132 may be in the range of 4000 Å to 10000 Å. In a case in which the thickness is smaller than 4000 Å, electrical reliability may be worsened when a device is operated. In a case in which the thickness is larger than 10000 Å, reliability may be degraded due to a pressure or thermal stress applied to the device during a process, and there may be a problem in that a unit cost of the device is increased due to an increased process time. The thicknesses of the first insulation layer 131 and the second insulation layer 132 are not limited thereto.

The junction layer 160 may include a conductive material. As an example, the junction layer 160 may include a material selected from the group consisting of Au, Sn, In, Al, Si, Ag, Ni, and Cu or an alloy thereof.

The substrate 170 may be formed of a conductive material. As an example, the substrate 170 may include a metal or semiconductor material. The substrate 170 may be a metal with excellent electrical conductivity and/or thermal conductivity. In this case, heat generated when a light-emitting device is operated may be promptly emitted to the outside.

The substrate 170 may include a material selected from the group consisting of Si, Mo, Si, W, Cu, and Al or an alloy thereof.

The second electrode pad 166 may be formed with a conductive material. The second electrode pad 166 may have a single-layer or multi-layer structure and include Ti, Ni, Ag, and Au. As an example, the second electrode pad 166 may have a structure of Ti/Ni/Ti/Ni/Ti/Au.

The second electrode pad 166 may have a recessed central portion such that an upper surface thereof has at least one concave portion and at least one convex portion. A wire (not illustrated) may be bonded to the concave portion at the upper surface. Therefore, the second electrode pad 166 and the wire may be more firmly bonded to each other due to an increased contact area therebetween.

Since the second electrode pad 166 may serve to reflect light, light extraction efficiency is further improved as the second electrode pad 166 is closer to the light-emitting structure 120.

A distance between the second electrode pad 166 and the light-emitting structure 120 may be in the range of 5 μm to 30 μm. When the distance is smaller than 5 μm, it is difficult to secure a process margin. When the distance is larger than 30 μm, an area in which the second electrode pad 166 is disposed in the entire device is increased, and thus an area of the light-emitting layer 24 may be reduced, and an amount of light may be reduced.

A height of an upper surface of the convex portion of the second electrode pad 166 may be larger than that of the active layer 124. Therefore, the second electrode pad 166 may reflect light emitted in the horizontal direction of the device from the active layer 124 upward to improve light extraction efficiency and control an angle of beam spread.

A concave-convex portion may be formed at an upper surface of a light-emitting structure. Such a concave-convex portion may improve efficiency of extraction of light output from the light-emitting structure 120. An average height of the concave-convex portion may be different in accordance with a UV wavelength. In the case of UV-C, the concave-convex portion may have a height in the range of 300 μm to about 800 μm. Light extraction efficiency may be improved when the concave-convex portion has an average height in the range of 500 μm to about 600 μm.

A passivation layer 180 may be disposed at an upper surface and a side surface of the light-emitting structure 12. A thickness of the passivation layer 180 may be in the range of 2000 Å to 5000 Å. In a case in which the thickness is smaller than 2000 Å, since the thickness is insufficient for protecting the device from external moisture or foreign substances, electrical and optical reliabilities of the device may be worsened. When the thickness is larger than 5000 Å, since a stress applied to the device is increased, optical reliability may be degraded or a process time may be increased, and there may be a problem in that a unit cost of the device is increased.

Referring to FIG. 10, a protruding height H1 of the second recess 127 may be larger than a protruding height H2 of the first recess 128. Here, a protruding height may be defined as a vertical distance from the active layer 124 to upper surfaces of the first recess 128 and the second recess 127.

Specifically, the protruding height H1 of the second recess 127 may satisfy Expression 1 below.

$$H1 = W4 \times \tan(\theta 1)$$ [Expression 1]

Here, W4 is a distance from an intermediate point C1 between the first recess 128 and the second recess 127 neighboring each other to an upper surface C2 of the second recess, and θ1 is an angle formed between a virtual straight line, which indicates the shortest possible distance from the intermediate point C1 to an upper surface of the reflective layer 135, and a horizontal surface of the active layer 124. θ1 is in the range of 0.5° to 5.0°.

In a case in which θ1 is less than 0.5°, the height of the reflective layer is relatively decreased, and it may be difficult to perform an effective reflecting function. In a case in which θ1 exceeds 5.0°, since the height of the reflective layer is increased, there is a problem in that an area of the active layer excessively reduced in proportion to the height increase. Also, there is a problem in that a recess process and an insulation layer process should be more precisely managed.

As an example, the distance from the intermediate point C1 between a lower surface of the first recess 128 and a lower surface of the second recess 127, which are spaced the shortest possible distance from each other, to the upper surface C2 of the second recess may be in the range of 20 μm to 40 μm. The protruding height of the second recess 127 may be in the range of about 300 nm to 800 nm. In this case, light emitted in the TM mode from the active layer 124 may be effectively reflected upward.

The second recess 127 may be formed higher than the first recess 128. However, embodiments are not necessarily limited thereto, and the height of the first recess 128 and the height of the second recess 127 may also be equal to each other.

An angle of inclination θ2 of the first recess 128 may be in the range of 40° to 70° or in the range of 60° to 70°, and an angle of inclination θ3 of the second recess 127 may be in the range of 40° to 70° or in the range of 60° to 70°.

Figure 11:
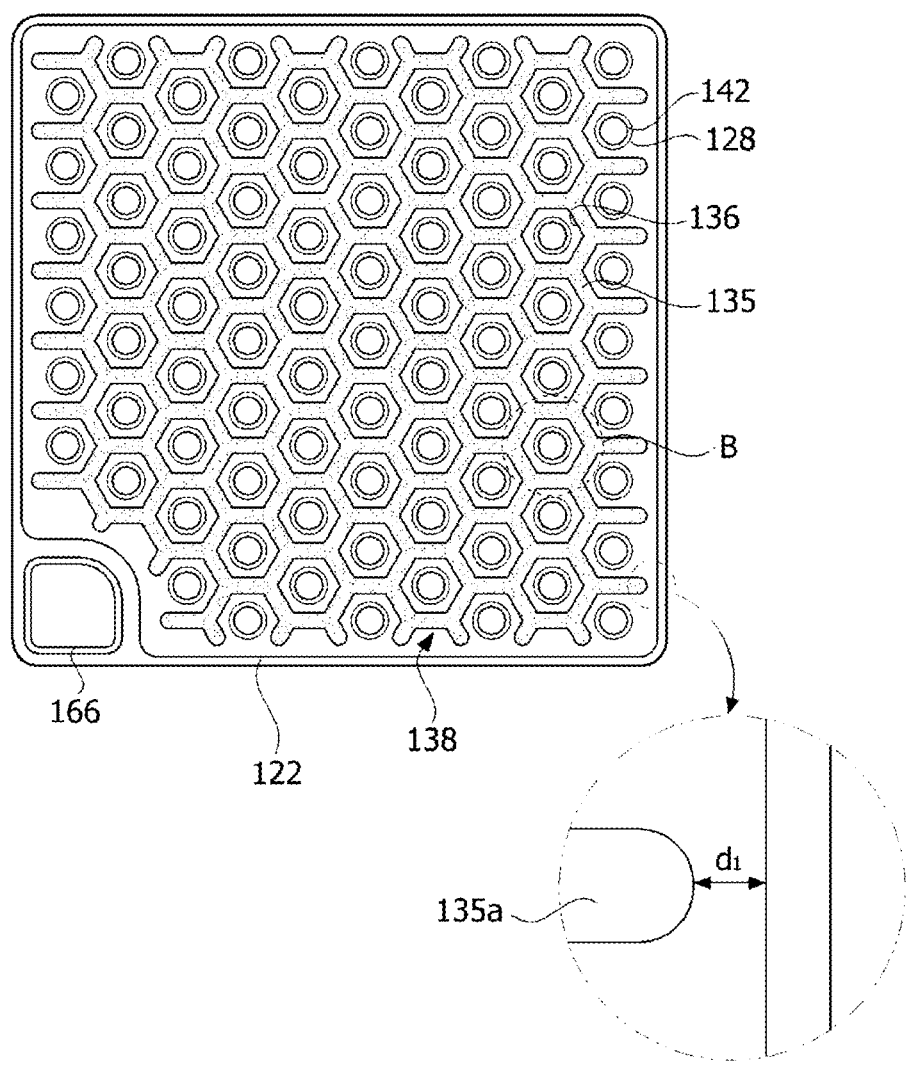
FIG. 11 is a plan view of a light-emitting device according to a seventh embodiment of the present disclosure.
Figure 12:
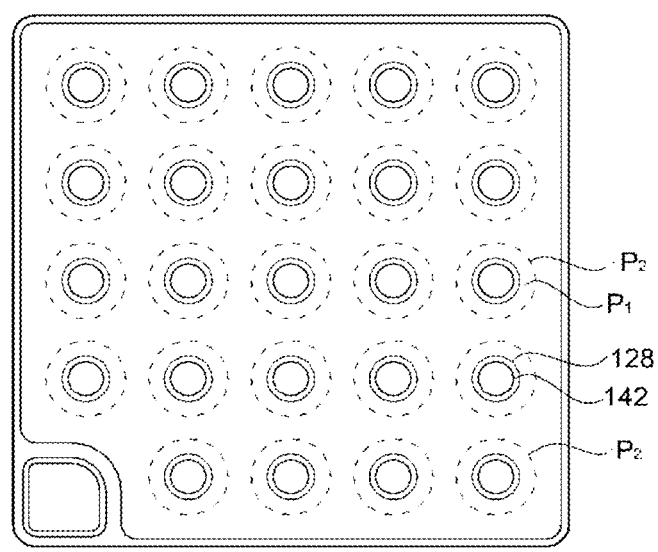
FIG. 12 is a view showing distribution of current densities of a light-emitting device.
Figure 13A:
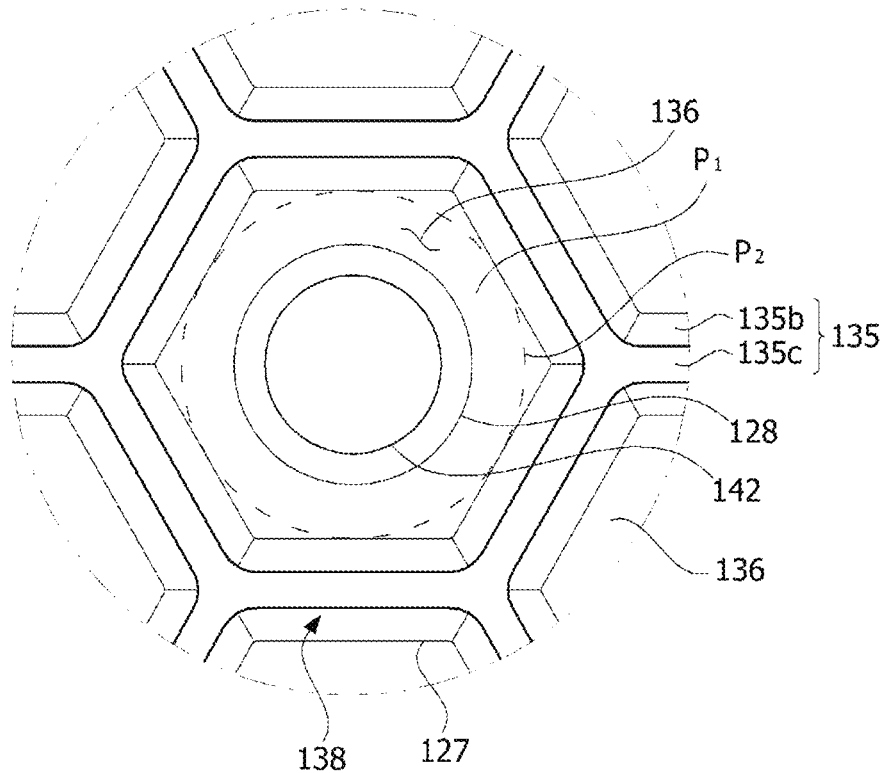
FIG. 13A is an enlarged view of Portion B in FIG. 11.
Figure 13B:
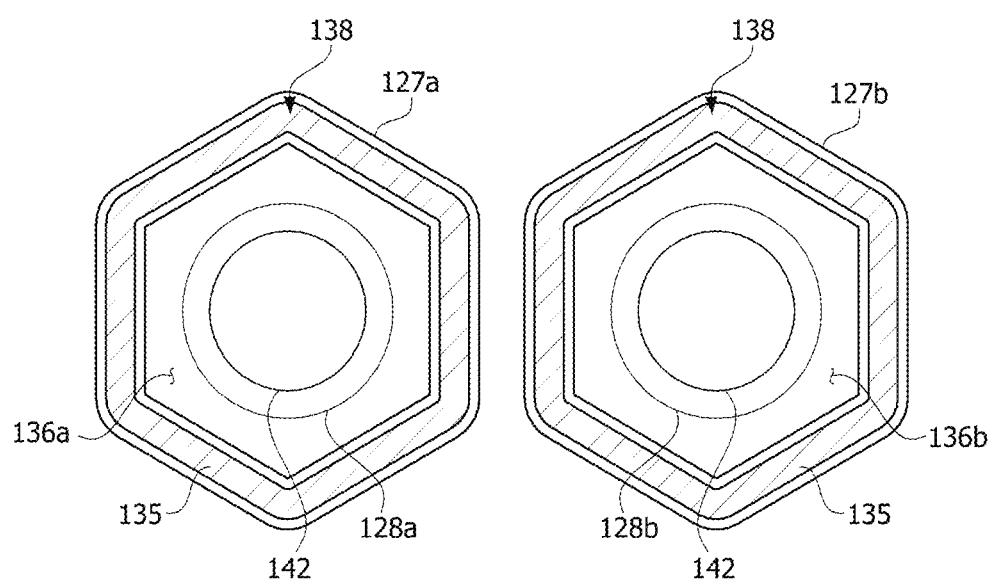
FIG. 13B is a first modified example of FIG. 13A.
Figure 14:
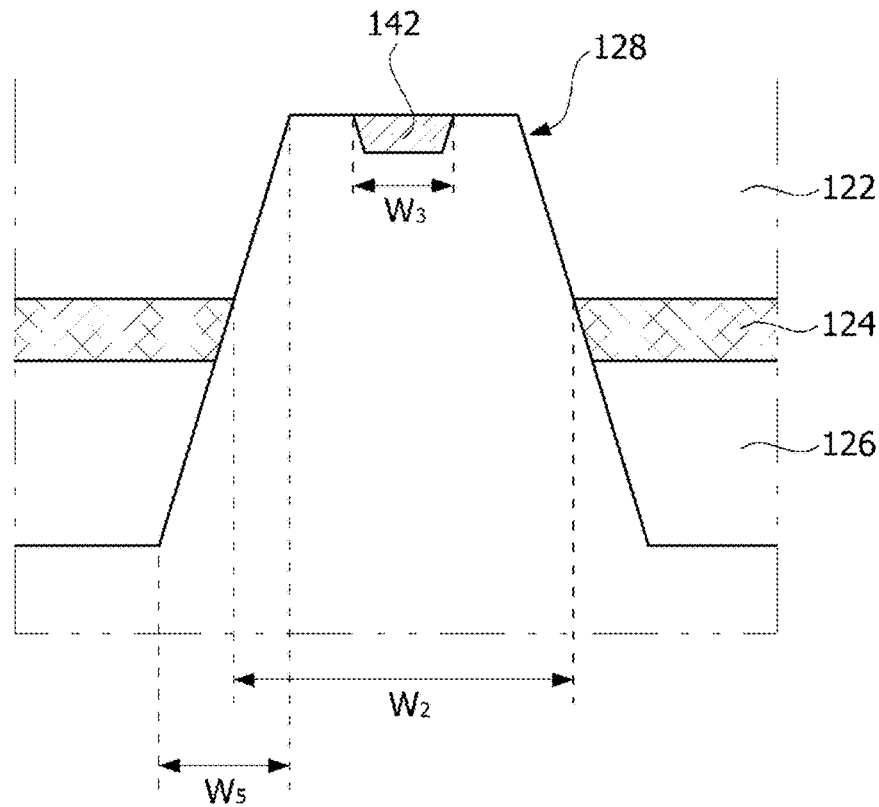
FIG. 14 is a view showing a first recess.
Figure 15:
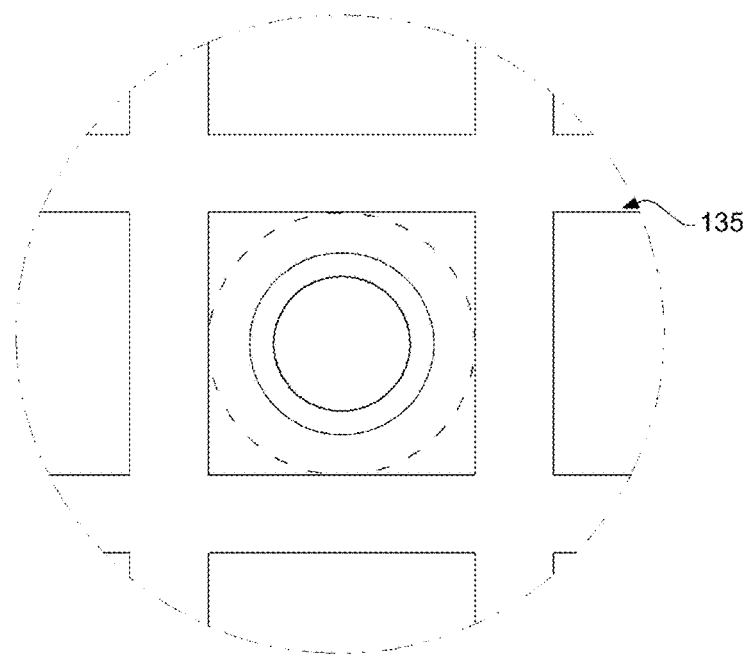
FIG. 15 is a second modified example of FIG. 13.

FIG. 11 is a plan view of a light-emitting device according to a seventh embodiment of the present disclosure, FIG. 12 is a view showing distribution of current densities of a light-emitting device, FIG. 13A is an enlarged view of Portion B in FIG. 11, FIG. 13B is a first modified example of FIG. 13A, FIG. 14 is a view showing a first recess, and FIG. 15 is a second modified example of FIG. 13.

Referring to FIG. 11, a light-emitting device 100 may include a plurality of light-emitting regions 136 partitioned by a reflective layer 135 in plan view. The light-emitting region 136 may be an independent space partitioned by the reflective layer 135. The light-emitting region 136 may have various shapes. As an example, the light-emitting region 136 may have a polygonal shape or a circular shape.

A plurality of first electrodes 142 and first recesses 128 may be respectively disposed in the light-emitting regions 136. According to such a structure, the first electrode 142 to which a current is distributed is surrounded by the reflective layer 135. Therefore, light emitted from around the first electrode 142 may be reflected upward by the reflective layer 135 surrounding the light-emitting region 136.

The reflective layer 135 may be disposed in a region connecting regions in which current densities are 40% or lower with respect to the current density of the first electrode 142 as 100%. For example, a distance between the center of the first recess and the center of the second recess disposed horizontal to the center of the first recess may be in the range of 30 μm to 40 μm.

When the distance is smaller than 30 μm, an active layer in a region in which current spreading occurs well may be etched, and there may be a problem in that light emission efficiency is decreased. When the distance is larger than 40 μm, a region in which the current spreading characteristic is not high may be remained, and light extraction efficiency may be degraded. In a case in which a reflective layer is formed in a region in which a current density is 30% or lower, since an area of an isolated region becomes too large, efficiency may be decreased. Also, most of light output sideward is highly likely to be absorbed in a light-emitting structure.

The reflective layer 135 may include a plurality of end portions 135a adjacent to an edge of a first conductive semiconductor layer 122, and an interval d1 between the end portion 135a and the edge of the first conductive semiconductor layer 122 may be in the range of 1.0 μm to 10 μm. In a case in which the interval is smaller than 1.0 μm, it may be difficult to secure a process margin. In a case in which the interval is larger than 10 μm, since a region in which the current spreading characteristic is not high is not utilized, light extraction efficiency may be degraded. However, embodiments are not necessarily limited thereto, and the end portion 135a of the reflective layer 135 may also be sealed to form an isolated region.

Referring to FIG. 12, when the composition of Al is increased, the current distribution effect may be weakened. Therefore, a current may only be distributed to points in the vicinity of the first electrodes 142, and current densities may be sharply lowered at points far from the first electrodes 142. Therefore, an effective light-emitting region P2 is narrow. The effective light-emitting region P2 may be defined as a boundary point at which the current density is 40% or lower with respect to a point P1 in the vicinity of the first electrode at which the current density is the highest.

For example, a distance between the center of the first recess and the center of the second recess disposed horizontal to the center of the first recess may be in the range of 30 μm to 40 μm. When the distance is smaller than 30 μm, an active layer in a region in which current spreading occurs well may be etched, and there may be a problem in that light emission efficiency is decreased. When the distance is larger than 40 μm, a region in which the current spreading characteristic is not high may be remained, and light extraction efficiency may be degraded.

Particularly, since a current density at the intermediate point between the neighboring first electrodes 142 is low, efficiency of the intermediate point contributing to light emission may be very low. Therefore, according to an embodiment, a reflective layer may be formed at a region in which a current density is low to improve light extraction efficiency.

Referring to FIG. 13A, the reflective layer 135 may include an inclined portion 135d and an upper surface portion 135c. Most of light output from the active layer 124 may be reflected upward by the inclined portion 135d. The upper surface portion 135c of the reflective layer 135 may be disposed to be flat. When the upper surface portion 135c is disposed to be flat, the upper surface portion 135c may reflect light internally reflected in the light-emitting structure 120 upward and improve light extraction efficiency.

The light-emitting region 136 defined by the reflective layer 135 may have an area that is 2.0 to 5.0 times that of the first electrode 142. In this case, the reflective layer 135 may be formed in a region in which a current density is 40% or lower with respect to the first electrode 142. For example, the distance between the center of the first recess 128 and the center of the second recess 127 disposed horizontal to the center of the first recess 128 may be in the range of 30 μm to 40 μm. The light-emitting region 136 defined by the reflective layer 135 may also have an area that is 2.0 to 5.0 times that of the first recess 128. The area of the light-emitting region 136 may be adjusted in accordance with the concentration of Al in the light-emitting structure 120.

The reflective layer 135 may be disposed so that the center of the reflective layer 135 is disposed at a region in which the current density is decreased to 40% or lower, e.g. at a point that is spaced 30 μm to 40 μm apart from the center of the first recess 128. A width of the reflective layer 135 may be in the range of 2 μm to 5 μm.

When the width of the reflective layer 135 is smaller than 2 μm, a step coverage characteristic of a material forming the reflective layer 135 may be degraded, and crack or separation may be caused. When the width is larger than 5 μm, an effective active layer may be etched, and there may be a problem in that light emission efficiency is decreased.

The reflective layer 135 may have a plurality of reflective walls 138 formed of straight lines coming into contact with a boundary region in which the current density is decreased to 40% or lower. For example, when the boundary region has a circular shape, the reflective wall 138 may have a polygonal shape formed with straight lines.

Although the plurality of reflective walls 138 may be connected to each other and form the plurality of light-emitting regions 136 as illustrated in FIG. 13A, embodiments are not necessarily limited thereto. As an example, a plurality of reflective walls 138 may be disposed to be spaced apart from each other as illustrated in FIG. 13B.

Referring to FIG. 13B, the first recess 128 may include a first-first recess 128a and a first-second recess 128b neighboring each other. The second recess may include a second-first recess 127a and a second-second recess 127b neighboring each other.

The second recess 127 may be disposed between the first-first recess 128a and the first-second recess 128b, and the first recess 128 may be disposed between the second-first recess 127a and the second-second recess 127b. Although the second-first recess 127a and the second-second recess 127b may have a hexagonal structure, embodiments are not necessarily limited thereto.

In this case, a first light-emitting region 136a may be configured by the first-first recess 128a being surrounded by the second-first recess 127a, and a second light-emitting region 136b may be configured by the first-second recess 128b being surrounded by the second-second recess 127b. Therefore, the first light-emitting region 136a and the second light-emitting region 136b may have a structure in which a second conductive semiconductor layer and an active layer are separated from each other.

The second-first recess 127a and the second-second recess 127b may be connected to each other as illustrated in FIG. 13A or may be spaced apart from each other as illustrated in FIG. 13B.

Referring to FIG. 14, an active layer 124 is removed from a region in which the first recess 128 is formed, and thus the region does not participate in light emission. An area which actually does not participate in light emission is a first area W2 from which the active layer 124 is removed. The width of the first recess 128 may vary in accordance with a width W5 of an inclined surface. Therefore, it may be preferably to manufacture the inclined surface to have a large angle of inclination. As an example, the angle of the inclined surface may be in the range of 40° to 70° or in the range of 60° to 70°.

Referring to FIG. 15, as the shape of the reflective layer 135, quadrilateral matrices may be continuously disposed. In this way, the shape of the light-emitting region 136 formed by the reflective layer 135 may be changed in various ways. As an example, the shape of the light-emitting region 136 may be hexagonal, octagonal, triangular, or circular.

Figure 16:
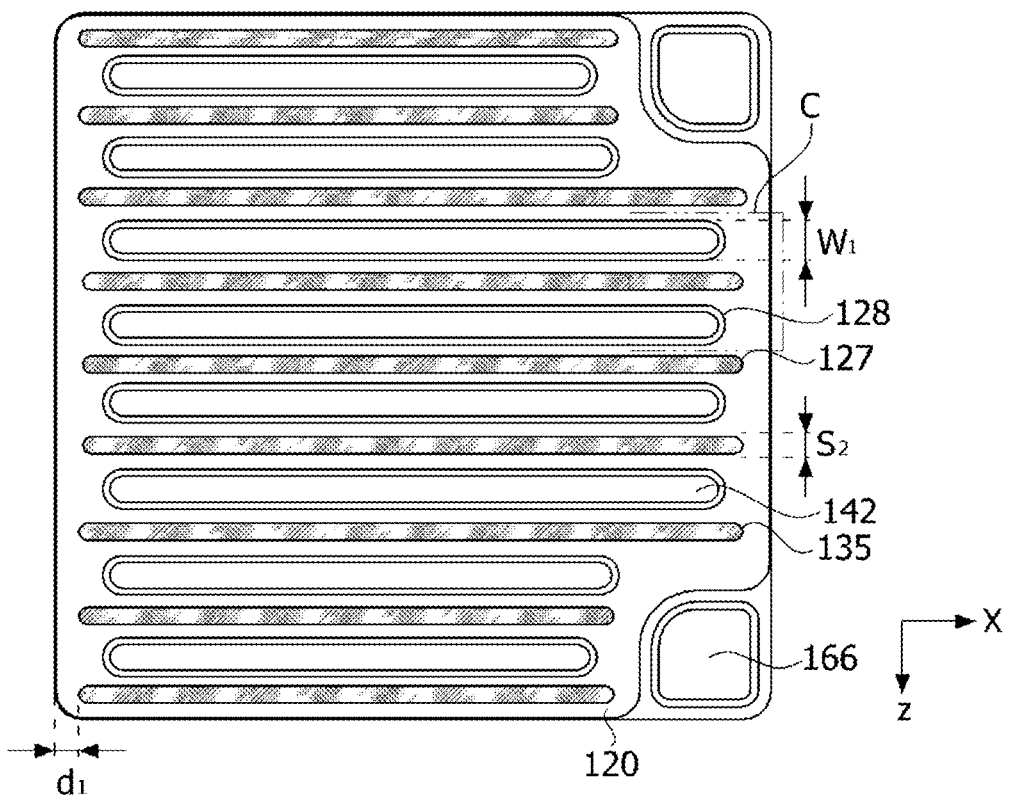
FIG. 16 is a plan view of a light-emitting device according to an eighth embodiment of the present disclosure.
Figure 17:
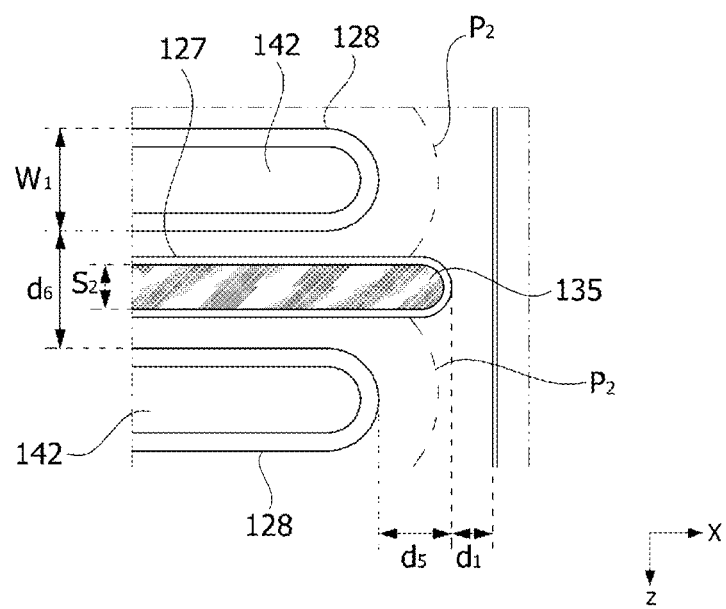
FIG. 17 is an enlarged view of Portion C in FIG. 16.
Figure 18:
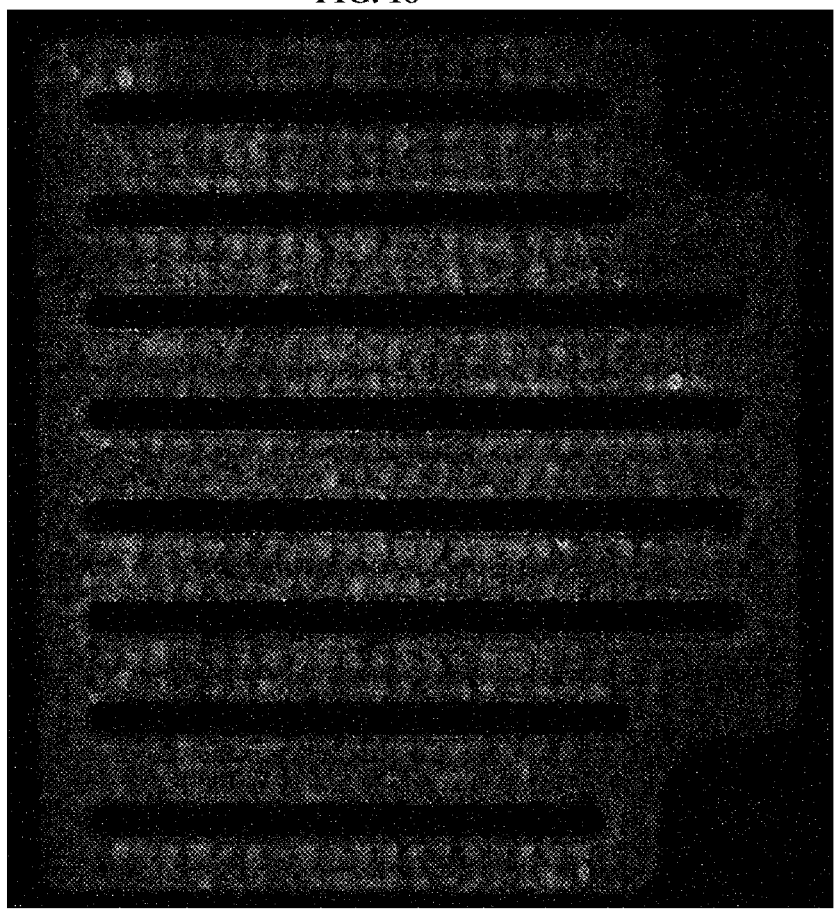
FIG. 18 is a photograph of a light-emitting structure to which power is applied.

FIG. 16 is a plan view of a light-emitting device according to an eighth embodiment of the present disclosure, FIG. 17 is an enlarged view of Portion C in FIG. 16, and FIG. 18 is a photograph of a light-emitting structure to which power is applied.

Referring to FIGS. 16 and 17, first recesses 128 may extend in a first direction (X-direction) and may be spaced apart from each other in a second reaction (Z-direction). Here, the first direction may be a direction perpendicular to a thickness direction of a light-emitting structure 120 (Y-direction). Widths (areas) of the first recess 128 and the second recess 127 are defined below as regions formed below the light-emitting structure 120.

A first electrode 142 may be disposed inside the first recess 128. An area of the first electrode 142 may be controlled by adjusting the number of first recesses 128 or adjusting a length in which the first recesses 128 extend in the first direction.

In a UV light-emitting structure with a high concentration of Al, since current distribution is relatively difficult, an area of the first electrode is required to be increased in comparison to a GaN light-emitting structure that emits blue light. According to an embodiment, since the plurality of first electrodes 142 come into contact with a first conductive semiconductor layer in the first direction, a current injection area may be increased.

In this case, in a case in which the first recess 128 is excessively formed to increase the area of the first electrode 142, since areas of the active layer 124 and the second electrode 146 are reduced, it is important to maintain an appropriate area ratio.

A width W1 of the first recess 128 may be in the range of 30 μm to 60 μm. In a case in which the width W1 of the first recess 128 is smaller than 30 μm, since an area thereof in which the first electrode 142 is disposed is narrow, and electron injection may not be smoothly performed, an operating voltage may be increased. In a case in which the width W1 is larger than 60 μm, an active layer may be excessively reduced, and an optical output may be lowered.

A distance d6 between the first recesses 128 may be in the range of 20 μm to 60 μm. In a case in which the distance d6 is smaller than 20 μm, an active layer may be excessively reduced, and an optical output may be lowered. In a case in which the distance is larger than 60 μm, the number of the first recesses 128 is reduced, and it is difficult to secure a sufficient area of the first electrodes 142.

The area of the plurality of first electrodes 142 may be 19% to 29% with respect to the maximum area of the light-emitting structure 120 in the first direction as 100%. In a case in which the area of the first electrode 142 is smaller than 19%, sufficient injection and spreading of currents may become difficult. In a case in which the area of the first electrode 142 is larger than 29%, since an area in which the active layer 124 and the second electrode 146 may be disposed is reduced, there are problems in that an optical output is lowered and an operating voltage is increased.

The area of the plurality of recesses 128 may be 30% to 45% with respect to the maximum area of the light-emitting structure 120 in the first direction as 100%. In a case in which the area of the first recess 128 is smaller than 30%, there is a problem in that an area of the first electrode 142 is decreased. In a case in which the area of the first recess 128 is larger than 45%, since an area in which the active layer 124 and the second electrode 146 may be disposed is reduced, there are problems in that an optical output is lowered and an operating voltage is increased.

A plurality of second recesses 127 may extend in the first direction (X-direction) and may be spaced apart from each other in the second reaction (Z-direction). The second recess 127 may be disposed between the plurality of first recesses 128.

The reflective layer 135 may be disposed inside the second recess 127. Therefore, the reflective layer 135 may be disposed at both side surfaces of the plurality of first electrodes 142 and reflect light emitted from around the first electrodes 142 upward. The width S2 of the reflective layer 135 may be larger than or equal to the width of the second recess 127.

When the composition of Al is increased, the current distribution effect may be weakened. Therefore, a current may only be distributed to points in the vicinity of the first electrodes 142, and current densities may be sharply lowered at points far from the first electrodes 142. Therefore, an effective light-emitting region P2 narrows.

The effective light-emitting region P2 may be defined as a boundary point at which the current density is 30% to 40% with respect to the current density at the center of the first electrode 142 as 100%. For example, a point spaced 5 μm to 40 μm apart from the center of the first recess 128 in the second direction may be defined as the boundary point. However, the boundary point may vary in accordance with the level of an injected current and the concentration of Al.

The reflective layer 135 may be disposed at the boundary point at which the current density is 30% to 40%. That is, according to an embodiment, the reflective layer 135 may be formed in a region in which a current density is low to improve light extraction efficiency.

A length of the second recess 127 in the first direction may be larger than a length of the first recess 128 in the first direction. When the length of the second recess 127 is equal to or shorter than a length of a neighboring first recess 128, light emitted from an end point of the first recess 128 is unable to be controlled.

Here, the first recesses 128 neighboring the second recess 127 may be two first recesses 128 disposed to be closest to the second recess 127 in the second direction (Z-direction). That is, the second recess 127 may be formed to be longer than at least one of the two first recesses 128 disposed horizontally adjacent to the second recess 127.

One end of the second recess 127 may be disposed to be longer than one end of the first recess 128 (d5). The length of the second recess 127 in the first direction may be 104% or more of the length of the first recess 128 disposed adjacent to the second recess 127 in the first direction. In this case, light output from around both ends of the first electrode 142 may be effectively reflected upward.

A separation distance dl between the second recess 127 and a side surface of the light-emitting structure 120 may be in the range of 1.0 µm to 10 µm. In a case in which the separation distance d1 is smaller than 1.0 µm, since it is difficult to secure a process margin, it is difficult for the capping layer 150 to be disposed to surround the reflective layer 135, and thus reliability may be degraded. In a case in which the separation distance dl is larger than 10 µm, an area participating in light emission may be reduced, and light extraction efficiency may be degraded. However, embodiments are not necessarily limited thereto, and the second recess 127 and the reflective layer 135 may also be formed up to the side surface of the light-emitting structure 120.

The area of the plurality of second recesses 127 may be 4% to 10% with respect to the maximum area of the light-emitting structure 120 in the first direction as 100%. In a case in which the area of the second recess 127 is smaller than 4%, it is difficult to form the reflective layer 135 inside the second recess 127. In a case in which the area of the second recess 127 is larger than 10%, an area of an active layer may be reduced, and an optical output may be weakened.

The area of the reflective layer 135 may be 46% to 70% with respect to the maximum area of the light-emitting structure 120 in the first direction as 100%. An actual region of the reflective layer 135 that reflects light may be equal to or smaller than the area of the second recess 127. Here, the area of the reflective layer 135 is an area including an extension extending to the lower surface of the light-emitting structure 120 to cover the second electrode 146.

The area of the second electrode 146 may be 57% to 86% with respect to the maximum area of the light-emitting structure 120 in the first direction as 100%. In a case in which the area of the second electrode 146 is smaller than 57%, an operating voltage may be increased. In a case in which the area is larger than 86%, the area of the first electrode 142 may be reduced, and efficiency of injection and distribution of currents may be lowered.

The area of the second electrode 146 may be an area of the light-emitting structure 120 from which the areas of the first recess 128 and the second recess 127 are excluded. Therefore, the second electrode 146 may be a single electrode that is connected as a whole.

Figure 19:
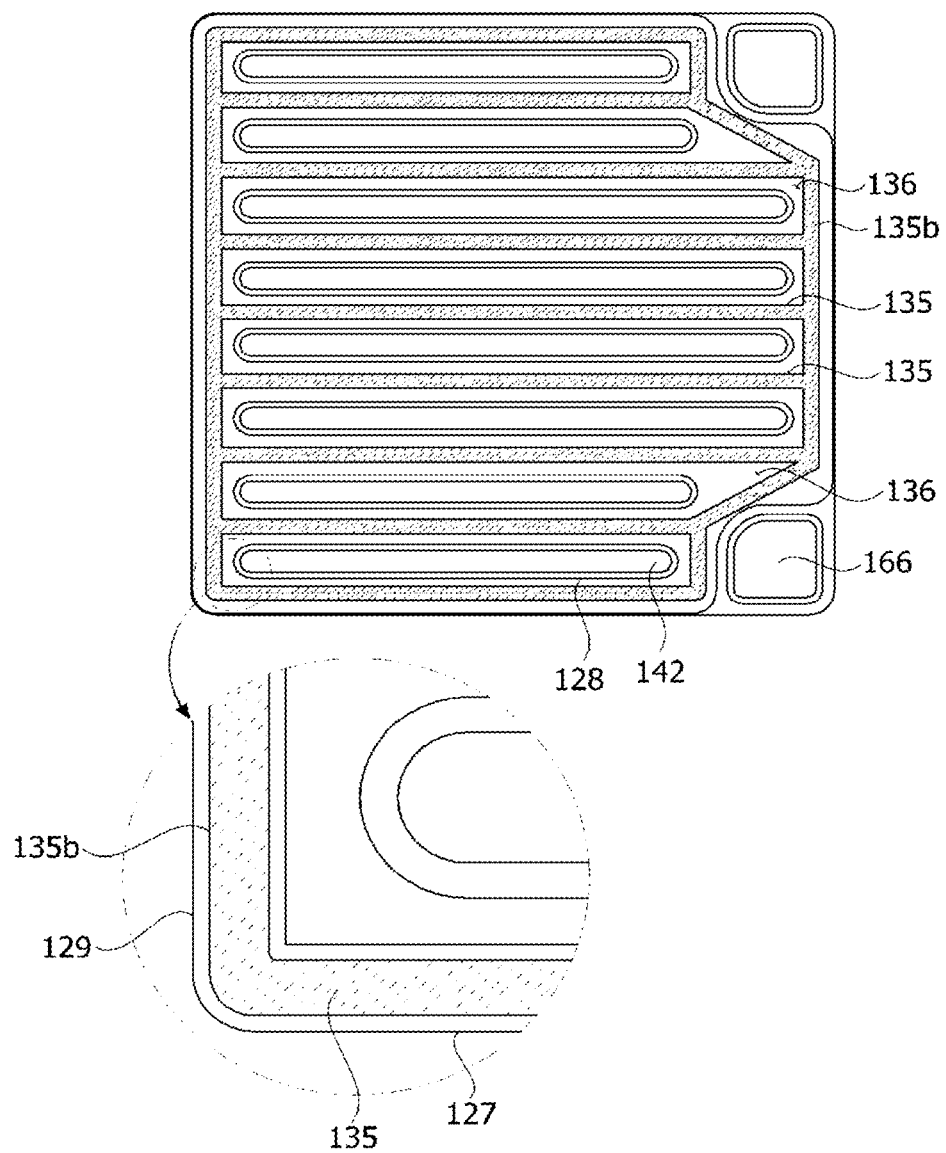
FIG. 19 is a plan view of a light-emitting device according to a ninth embodiment of the present disclosure.
Figure 20A:
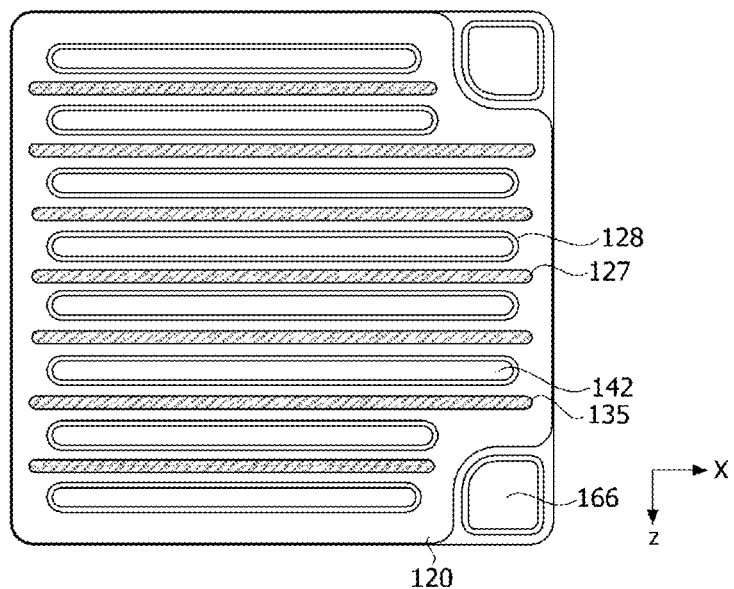
FIGS. 20A and 20B are views showing a light-emitting device according to a tenth embodiment of the present disclosure.
Figure 20B:
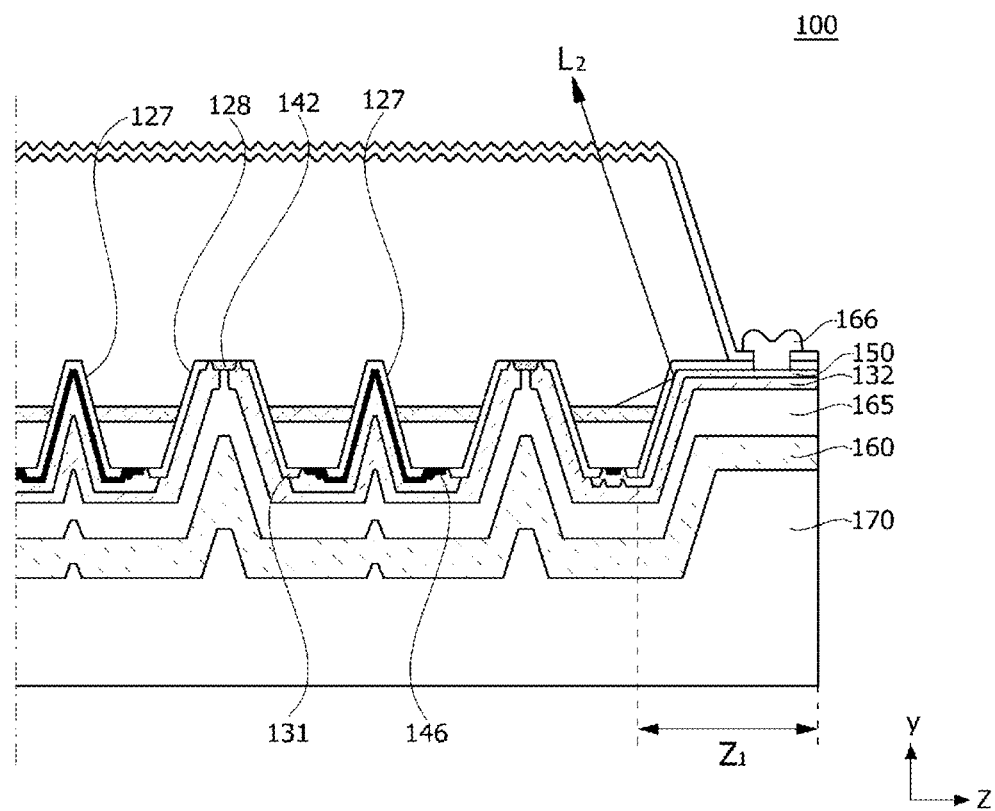
Figure 21:
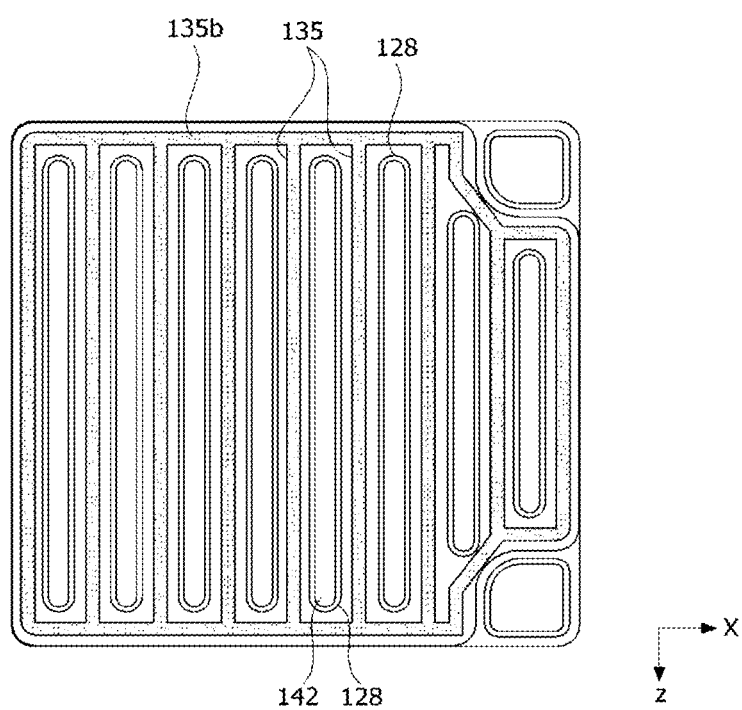
FIG. 21 is a view showing a light-emitting device according to an eleventh embodiment of the present disclosure.
Figure 22:
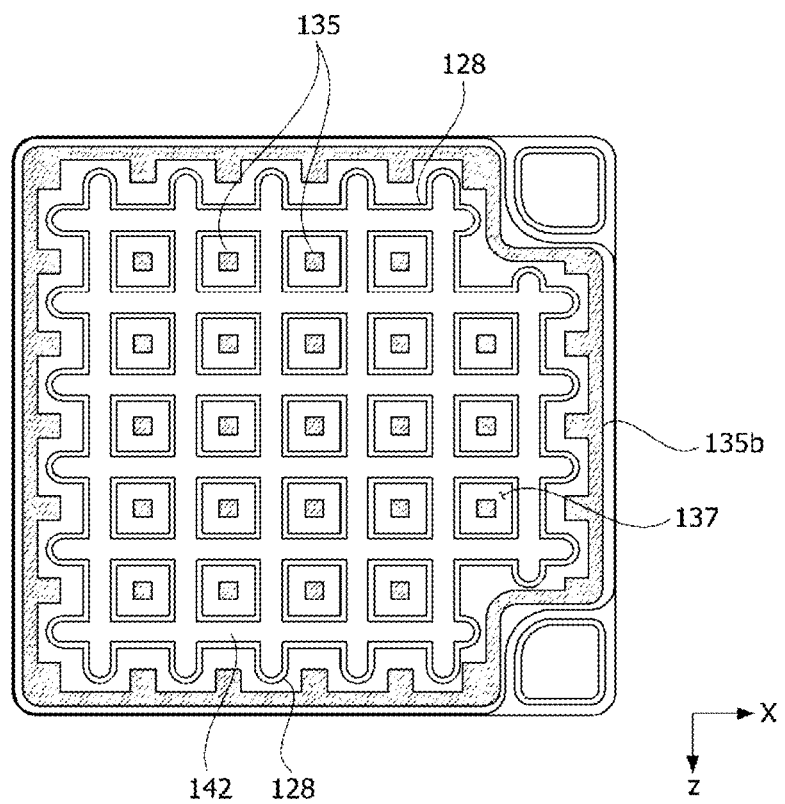
FIG. 22 is a view showing a light-emitting device according to a twelfth embodiment of the present disclosure.

FIG. 19 is a plan view of a light-emitting device according to a ninth embodiment of the present disclosure, FIGS. 20A and 20B are views showing a light-emitting device according to a tenth embodiment of the present disclosure, FIG. 21 is a view showing a light-emitting device according to an eleventh embodiment of the present disclosure, and FIG. 22 is a view showing a light-emitting device according to a twelfth embodiment of the present disclosure.

Referring to FIG. 19, a side reflective part 135b connected to both ends of a plurality of reflective layers 135 may be included. That is, a third recess 129 may be formed at an edge of a light-emitting structure 120, and the side reflective part 135b may be formed inside the third recess 129. The reflective layer 135 and the side reflective part 135b may include the same reflective material. As an example, the reflective layer 135 and the side reflective part 135b may include Al.

The plurality of reflective layers 135 and the side reflective part 135b may be electrically connected to each other or be spaced apart from each other.

In a case in which the plurality of reflective layers 135 and the side reflective part 135b are connected to each other, a plurality of first regions 136 may be formed. The plurality of first regions 136 may be spaces that are spaced apart from each other by the plurality of reflective layers 135.

A first recess 128 and a first electrode 142 may be disposed in each of the plurality of first regions 136. According to such a configuration, light emitted from around both ends of the first electrode 142 may be effectively reflected upward.

A second electrode may be separated into a plurality of second electrodes by a second recess 127 and a third recess. The divided plurality of second electrodes 146 may be electrically connected to each other by extensions of the reflective layers 135.

Referring to FIG. 20A, the reflective layer 135 may not be disposed at an edge of the light-emitting device. That is, due to various reasons such as a process margin, the first recess 128 may be disposed at the edge, or the second recess 127 may be disposed at the edge.

Referring to FIG. 20B, a capping layer 150, a first conductive layer 165, and a substrate 70 may protrude from an edge portion Z1 of a light-emitting device and reflect light L2 emitted from an active layer 124 upward. That is, a side reflective part may be formed at the edge portion Z1 of the light-emitting device. Therefore, even when a separate reflective layer is not formed, light emitted from an outermost portion may be reflected upward.

An angle between the capping layer 150 and a lower surface of a second conductive semiconductor layer 126 may be in the range of 90° to 145°. In a case in which the angle is smaller than 90° or larger than 145°, efficiency in which light moving sideward is reflected upward may be decreased.

According to such a configuration, light emitted from between the plurality of first recesses 128 may be reflected upward by the reflective layer 135, and light emitted from an edge of the light-emitting structure 120 may be reflected upward by the capping layer 150.

Referring to FIG. 21, a plurality of reflective layers 135 may also extend in the second direction (Z-direction) and be spaced apart from each other in the first direction X-direction). The arrangement of first recesses 128 and second recesses 127 may be properly changed in accordance with a position of an electrode pad, and the like.

Referring to FIG. 22, first recesses 128 and first electrodes 142 may respectively extend in the first direction and the second direction. Therefore, a plurality of second regions 137 may be formed at regions at which the first recesses 128 intersect each other.

A plurality of reflective layers 135 may be respectively disposed in the second regions 137 to reflect light upward. A side reflective part 135b may be disposed at an edge of a light-emitting structure 120. The plurality of reflective layers 135 and the side reflective part 135b may be electrically connected to each other through second electrodes. However, embodiments are not necessarily limited thereto, and the plurality of reflective layers 135 and the side reflective part 135b may also be electrically insulated from each other.

The light-emitting device may be configured with a package and be used to harden a resin, a resist, a spin-on-dielectric (SOD), or a spin-on-glass (SOG). Alternatively, the light-emitting device may also be used for a therapeutic or medical purpose or used to sterilize an air purifier, a water purifier, or the like.

The light-emitting device may be used as a light source of a lighting system or used as a light source of an image display device or a light source of a lighting device. That is, the light-emitting device may be disposed in a case and applied to various electronic devices that provide light. As an example, when the light-emitting device and a red, green, blue (RGB) fluorescent substance are used in combination, white light having excellent color rendering property (CRI) may be implemented.

The above-described light-emitting device may be configured with a package and used as a light source of a lighting system. For example, the light-emitting device may be used as a light source of an image display device or a light source of a lighting device or the like.

The light-emitting device may be used as an edge type backlight unit or a direct type backlight unit when being used as a backlight unit of an image display device. The light-emitting device may be used a lighting fixture or a bulb type when being used as a light source of a lighting device. The light-emitting device may also be used as a light source of a mobile terminal.

In addition to the above-described light-emitting diode, the light-emitting device also includes a laser diode.

Like the light-emitting device, the laser diode may include a first conductive semiconductor layer, an active layer, and a second conductive semiconductor layer having the above-described structure. Although an electroluminescence phenomenon in which light is emitted when a current is flowed after a p-type first conductive semiconductor and an n-type second conductive semiconductor are joined to each other, there are differences in terms of directivity and phase of emitted light. That is, the laser diode uses a phenomenon referred to as stimulated emission, a constructive interference phenomenon, and the like so that light having a single specific wavelength (monochromatic beam) may be emitted in the same direction with the same phase. Due to such a characteristic, the laser diode may be used in optical communication, medical equipment, and semiconductor process equipment, and the like.

An example of a light receiving device may include a photodetector, which is a type of a transducer that detects light and converts intensity of the light into an electrical signal. Such photodetectors include a photoelectric cell (Si, Se), an optical output device (cadmium sulfide, cadmium selenide), a photodiode (PD) (for example, a PD having a peak wavelength in a visible blind spectral region or a true blind spectral region), a phototransistor, a photomultiplier, a phototube (vacuum, gas-filled), an infrared (IR) detector, and the like, but embodiments are not limited thereto.

Generally, a light-emitting device such as a photodetector may be manufactured using a direct bandgap semiconductor with excellent optical conversion efficiency. Alternatively, there are photodetectors having various structures, and photodetectors having the most common structures include a pin-type photodetector using a p-n junction, a Schottky-type photodetector using a Schottky junction, and a metal semiconductor metal (MSM) type photodetector.

A photodiode may include a first conductive semiconductor layer, an active layer, and a second conductive semiconductor layer having the above-described structure like the light-emitting device, and be formed of a p-n junction or a pin structure. The photodiode is operated by a reverse bias or zero bias being applied thereto, and when light is incident on the photodiode, electrons and holes are generated, and a current flows. In this case, the size of the current may be almost proportional to the intensity of light incident on the photodiode.

A photoelectric cell or solar cell is a type of photodiode, and may convert light into a current. The solar cell may include a first conductive semiconductor layer, an active layer, and a second conductive semiconductor layer having the above-described structure like the light-emitting device.

The light-emitting device may also be used as a rectifier of an electronic circuit through a rectifying characteristic of a general diode using a p-n junction, and may be applied to a microwave circuit and applied to an oscillation circuit or the like.

The above-described light-emitting device is not necessarily implemented only with a semiconductor and may further include a metal material according to circumstances. For example, a light-emitting device such as a light receiving device may be implemented using at least one of Ag, Al, Au, In, Ga, N, Zn, Se, P, or As or may also be implemented using a semiconductor material doped with a p-type or n-type dopant or an intrinsic semiconductor material.

Although the present disclosure has been described above by focusing on embodiments thereof, the embodiments herein are merely illustrative and are not intended to limit the present disclosure. Those of ordinary skill in the art to which the present disclosure pertains should understand that various modifications and applications not described above may be possible within the scope not departing from essential characteristics of the present embodiments. For example, each element specifically illustrated in the embodiments may be modified and practiced. Differences related to such modifications and applications should be interpreted as belonging to the scope of the present disclosure defined in the attached claims.

The invention claimed is:

1. A light emitting device comprising:
   a conductive substrate;
   a light emitting structure on the conductive substrate and including a first conductivity type semiconductor layer, a second conductivity type semiconductor layer, and an active layer disposed between the first conductivity type semiconductor layer and the second conductivity type semiconductor layer, and a plurality of recesses that pass through the second conductivity type semiconductor layer, the active layer, and a portion of the first conductivity type semiconductor layer;
   a first electrode disposed between the light emitting structure and the conductive substrate; and
   an insulator disposed between the conductive substrate and the light emitting structure,
   wherein a lateral width of the conductive substrate is larger than a lateral width of the light emitting structure,
   wherein the insulator includes a plurality of openings in each of the plurality of the recesses, and a protrusion that pass through the second conductivity type semiconductor layer, the active layer, and extends to a portion of the first conductivity type semiconductor layer,
   wherein the first electrode electrically connects with the first conductivity type semiconductor layer via the plurality of openings in each of the plurality of recesses, and
   wherein the protrusion is provided as a closed protrusion loop to surround an inner area, wherein the closed protrusion loop to surround the plurality of openings by the plurality of openings being disposed within the inner area.

2. The light emitting device of claim 1, wherein the light emitting structure includes a trench that passes through the second conductivity type semiconductor layer, the active layer, and a portion of the first conductivity type semiconductor layer, the trench is provided as a closed trench loop,
wherein the protrusion is to extend into the trench,
wherein the first conductivity type semiconductor layer includes a first surface that defines each of the plurality of recesses and a second surface that defines the trench.

3. The light emitting device of claim 2, wherein the protrusion contacts the second surface entirely.

4. The light emitting device of claim 3, wherein a minimum lateral width of the trench is less than a maximum lateral width of each of the recesses.

5. The light emitting device of claim 4, wherein a minimum lateral width of the protrusion is less than each lateral width of the plurality of openings.

6. The light emitting device of claim 5, wherein the active layer emits light in various wavelength,
wherein a main-wavelength having the greatest relative intensity in the light is 100 nm to 420nm.

7. The light emitting device of claim 6, wherein a second electrode electrically contacts with the second conductivity type semiconductor layer,
wherein an extending electrode electrically contacts with the second electrode,
wherein a bonding pad disposed on the conductive substrate electrically contacts with the extending electrode,
wherein the light emitting structure and the bonding pad are separated from each other, and
wherein the extending electrode overlaps with the protrusion vertically.

8. The light emitting device of claim 7, wherein the light emitting structure includes a top surface, a bottom surface, and a plurality of outer side surfaces disposed between the top surface and the bottom surface,
wherein the protrusion extends along the plurality of outer side surfaces to provide the closed protrusion loop, and
wherein the top surface of the light emitting structure has a roughness.

9. The light emitting device of claim 8, wherein the average height of the roughness of the top surface of the light emitting structure is greater than 500 μm.

10. The light emitting device of claim 9, wherein the first electrode includes a plurality of contact electrodes disposed in each of the openings,
wherein the average height of the roughness of the top surface of the light emitting structure is less than 600 μm.

11. A light emitting device comprising:
a conductive substrate;
a light emitting structure on the conductive substrate including a first conductivity semiconductor layer, a second conductivity type semiconductor layer, and an active layer disposed between the first conductivity type semiconductor layer and the second conductivity type semiconductor layer, and a plurality of recesses that pass through the second conductivity type semiconductor layer, the active layer, and a portion of the first conductivity type semiconductor layer, and a trench that passes through the second conductivity type semiconductor layer, the active layer, and a portion of the first conductivity type semiconductor layer;
an insulator including a first insulator disposed in the plurality of recesses and a second insulator disposed in the trench;
a first electrode disposed between the light emitting structure and the conductive substrate;
a bonding pad disposed on the conductive substrate, and separated from the light emitting structure;
a second electrode electrically connected to the second conductivity type semiconductor layer and the bonding pad;
wherein the first insulator includes an opening on a top portion,
wherein the first electrode electrically contacts with the first conductivity type semiconductor layer via the opening,
wherein the light emitting structure includes a top surface, a bottom surface, and an outmost side surface disposed between the top surface and the bottom surface,
wherein the trench extends along the outmost side surface, and
wherein the trench surrounds the plurality of first insulator,
wherein the second insulator is provided as a closed loop to surround an inner area, wherein the closed loop to surround the opening of the first insulator by the opening being disposed within the inner area.

12. The light emitting device of claim 11, wherein the active layer emits light in various wavelength,
wherein a main-wavelength having the greatest relative intensity in the light is 100 nm to 420 nm.

13. The light emitting device of claim 12, wherein the top surface of the light emitting structure has a roughness.

14. The light emitting device of claim 13, wherein an extending electrode contacts with the second electrode and the bonding pad,
wherein the extending electrode overlaps with the trench vertically.

15. The light emitting device of claim 14, wherein the plurality of recess and the trench are concaved from the bottom surface of the light emitting structure towards the top surface of the light emitting structure.

16. The light emitting device of claim 15, wherein a distance between the light emitting structure and the bonding pad is 5 um to 30 um.

17. The light emitting device of claim 16, wherein the plurality of recesses and the trench including an inclined surface correspond to the bottom surface of the light emitting structure,
wherein an angle of each of the inclined surface is 40 degree to 70 degree.

18. The light emitting device of claim 17, wherein the plurality of recesses includes an outmost recess closest to the trench,
wherein a minimum distance between a center portion of the outmost recess and a center portion of the trench is 30 um to 40 um.

19. The light emitting device of claim 13, wherein the first electrode includes a plurality of contact electrodes disposed in each of the opening.

20. The light emitting device of claim 19, wherein the second insulator contacts with the first conductivity type semiconductor layer in the trench entirely,
wherein the second insulator surrounds the plurality of contact electrode as a closed-loop shape.

* * * * *